(12) United States Patent
den Boer et al.

(10) Patent No.: US 7,773,139 B2
(45) Date of Patent: Aug. 10, 2010

(54) IMAGE SENSOR WITH PHOTOSENSITIVE THIN FILM TRANSISTORS

(75) Inventors: Willem den Boer, Hillsboro, OR (US); Tin Nguyen, Beaverton, OR (US); Patrick J. Green, Beaverton, OR (US)

(73) Assignee: Apple Inc., Cupertino, CA (US)

( * ) Notice: Subject to any disclaimer, the term of this patent is extended or adjusted under 35 U.S.C. 154(b) by 1850 days.

(21) Appl. No.: 10/825,922

(22) Filed: Apr. 16, 2004

(65) Prior Publication Data

US 2005/0231656 A1    Oct. 20, 2005

(51) Int. Cl.
*H04N 3/14*   (2006.01)
*H04N 5/335*   (2006.01)
*G02F 1/136*   (2006.01)
*G09G 3/32*   (2006.01)

(52) U.S. Cl. .................. 348/302; 348/308; 348/309; 349/49; 349/42; 345/82

(58) Field of Classification Search ............... 348/281, 348/302, 307, 308; 345/82; 349/28, 42
See application file for complete search history.

(56) References Cited

U.S. PATENT DOCUMENTS

| | | | |
|---|---|---|---|
| 4,220,815 | A | 9/1980 | Gibson et al. |
| 4,320,292 | A | 3/1982 | Oikawa et al. |
| 4,334,219 | A | 6/1982 | Paülus et al. |
| 4,345,248 | A | 8/1982 | Togashi et al. |
| 4,405,921 | A | 9/1983 | Mukaiyama |
| 4,476,463 | A | 10/1984 | Ng et al. |
| 4,481,510 | A | 11/1984 | Hareng et al. |
| 4,484,179 | A | 11/1984 | Kasday |
| 4,490,607 | A | 12/1984 | Pease et al. |
| 4,496,981 | A | 1/1985 | Ota ............................ 348/294 |
| 4,542,375 | A | 9/1985 | Alles et al. |
| 4,603,356 | A | 7/1986 | Bates |
| 4,644,338 | A | 2/1987 | Aoki et al. |

(Continued)

FOREIGN PATENT DOCUMENTS

DE    3602796 A1    8/1987

(Continued)

OTHER PUBLICATIONS

Top Touch-Screen Options, from the website of Industrial Technology (www.industrialtechnology.co.uk/2001/mar/touch.html) dated Oct. 29, 2001, 2 pages.

(Continued)

*Primary Examiner*—Lin Ye
*Assistant Examiner*—Chia-Wei A Chen
(74) *Attorney, Agent, or Firm*—Morrison & Foerster LLP

(57) ABSTRACT

An image sensor array includes image sensors having photo TFTs to generate photocurrent in response to received images. The photo TFTs each have their respective gate electrodes and source electrodes independently biased to reduce the effects of dark current. Storage capacitors are coupled to each photo TFT and discharged upon generation of a photocurrent. Each storage capacitor is coupled to a readout TFT that passes a current from the storage capacitor to a data line. The photo TFT may be disposed above the storage capacitor to increase the exposed surface area of the photo TFT.

25 Claims, 25 Drawing Sheets

U.S. PATENT DOCUMENTS

| | | | |
|---|---|---|---|
| 4,655,552 A | 4/1987 | Togashi et al. | |
| 4,662,718 A | 5/1987 | Masubuchi | |
| 4,671,671 A | 6/1987 | Suetaka | |
| 4,677,428 A | 6/1987 | Bartholow | |
| 4,679,909 A | 7/1987 | Hamada et al. | |
| 4,684,939 A | 8/1987 | Streit | |
| 4,698,460 A | 10/1987 | Krein et al. | |
| 4,720,869 A | 1/1988 | Wadia | |
| 4,736,203 A | 4/1988 | Sidlauskas | |
| 4,740,782 A | 4/1988 | Aoki et al. | |
| 4,759,610 A | 7/1988 | Yanagisawa | 349/162 |
| 4,767,192 A | 8/1988 | Chang et al. | |
| 4,772,101 A | 9/1988 | Liu | |
| 4,782,327 A | 11/1988 | Kley et al. | |
| 4,782,328 A | 11/1988 | Denlinger | |
| 4,785,564 A | 11/1988 | Gurler | |
| 4,794,634 A | 12/1988 | Torihata et al. | |
| 4,814,760 A | 3/1989 | Johnston et al. | |
| 4,823,178 A | 4/1989 | Suda | |
| 4,838,655 A | 6/1989 | Hunahata et al. | |
| 4,877,697 A | 10/1989 | Vollmann et al. | |
| 4,893,120 A | 1/1990 | Doering et al. | |
| 4,904,056 A | 2/1990 | Castleberry | |
| 4,917,474 A | 4/1990 | Yamazaki et al. | |
| 5,003,356 A | 3/1991 | Wakai et al. | |
| 5,039,206 A | 8/1991 | Wiltshire | |
| 5,051,570 A | 9/1991 | Tsujikawa et al. | |
| 5,083,175 A | 1/1992 | Hack et al. | |
| 5,105,186 A | 4/1992 | May | |
| 5,140,153 A | 8/1992 | Heikkinen et al. | |
| 5,151,688 A | 9/1992 | Tanaka et al. | 345/104 |
| 5,153,420 A | 10/1992 | Hack et al. | |
| 5,172,104 A | 12/1992 | Tanigaki et al. | |
| 5,204,661 A | 4/1993 | Hack et al. | |
| 5,236,850 A | 8/1993 | Zhang | |
| 5,237,314 A | 8/1993 | Knapp | |
| 5,243,332 A | 9/1993 | Jacobson | |
| 5,276,538 A | 1/1994 | Monji et al. | |
| 5,301,048 A | 4/1994 | Huisman | |
| 5,339,090 A | 8/1994 | Crossland et al. | |
| 5,339,091 A | 8/1994 | Yamazaki et al. | |
| 5,341,133 A | 8/1994 | Savoy et al. | |
| 5,349,174 A | 9/1994 | Van Berkel et al. | |
| 5,376,948 A | 12/1994 | Roberts | |
| 5,381,251 A | 1/1995 | Nonomura et al. | 349/24 |
| 5,386,543 A | 1/1995 | Bird | |
| 5,387,445 A | 2/1995 | Horiuchi et al. | |
| 5,414,283 A | 5/1995 | den Boer et al. | |
| 5,422,693 A | 6/1995 | Vogeley et al. | |
| 5,430,462 A | 7/1995 | Katagiri et al. | |
| 5,445,871 A | 8/1995 | Murase et al. | |
| 5,446,564 A | 8/1995 | Mawatari et al. | |
| 5,461,400 A | 10/1995 | Ishii et al. | |
| 5,475,398 A | 12/1995 | Yamazaki et al. | |
| 5,483,263 A | 1/1996 | Bird et al. | |
| 5,485,177 A | 1/1996 | Shannon et al. | |
| 5,502,514 A | 3/1996 | Vogeley et al. | |
| 5,510,916 A | 4/1996 | Takahashi | |
| 5,515,186 A | 5/1996 | Fergason et al. | |
| 5,525,813 A | 6/1996 | Miyake et al. | |
| 5,532,743 A | 7/1996 | Komobuchi | |
| 5,568,292 A | 10/1996 | Kim | |
| 5,581,378 A | 12/1996 | Kulick et al. | |
| 5,585,817 A | 12/1996 | Itoh et al. | |
| 5,589,961 A | 12/1996 | Shigeta et al. | 349/41 |
| 5,598,004 A | 1/1997 | Powell et al. | |
| 5,610,629 A | 3/1997 | Baur | |
| 5,635,982 A | 6/1997 | Zhang et al. | |
| 5,637,187 A | 6/1997 | Takasu et al. | |
| 5,652,600 A | 7/1997 | Khormaei et al. | |
| 5,659,332 A | 8/1997 | Ishii et al. | |
| 5,677,744 A | 10/1997 | Yoneda et al. | 349/12 |
| 5,712,528 A | 1/1998 | Barrow et al. | |
| 5,751,453 A | 5/1998 | Baur | |
| 5,757,522 A | 5/1998 | Kulick et al. | |
| 5,767,623 A | 6/1998 | Friedman et al. | |
| 5,777,713 A | 7/1998 | Kimura | |
| 5,778,108 A | 7/1998 | Coleman, Jr. | |
| 5,793,342 A | 8/1998 | Rhoads | |
| 5,796,121 A | 8/1998 | Gates | |
| 5,812,109 A | 9/1998 | Kaifu et al. | |
| 5,818,037 A | 10/1998 | Redford et al. | |
| 5,818,553 A | 10/1998 | Koenck et al. | 349/61 |
| 5,831,693 A | 11/1998 | McCartney, Jr. et al. | |
| 5,834,765 A | 11/1998 | Ashdown | |
| 5,838,290 A | 11/1998 | Kuijk | |
| 5,838,308 A | 11/1998 | Knapp et al. | |
| 5,852,487 A | 12/1998 | Fujimori et al. | |
| 5,877,735 A | 3/1999 | King et al. | |
| 5,890,799 A | 4/1999 | Yiu et al. | |
| 5,917,464 A | 6/1999 | Stearns | |
| 5,920,360 A | 7/1999 | Coleman, Jr. | |
| 5,926,238 A | 7/1999 | Inoue et al. | |
| 5,930,591 A | 7/1999 | Huang | |
| 5,940,049 A | 8/1999 | Hinman et al. | |
| 5,942,761 A | 8/1999 | Tuli | |
| 5,959,617 A | 9/1999 | Bird et al. | |
| 5,959,697 A | 9/1999 | Coleman, Jr. | |
| 5,962,856 A | 10/1999 | Zhao et al. | |
| 5,966,108 A | 10/1999 | Ditzik | |
| 5,990,980 A | 11/1999 | Golin | |
| 5,990,988 A | 11/1999 | Hanihara et al. | |
| 5,995,172 A | 11/1999 | Ikeda et al. | |
| 6,020,590 A | 2/2000 | Aggas et al. | |
| 6,020,945 A | 2/2000 | Sawai et al. | |
| 6,023,307 A | 2/2000 | Park | |
| 6,028,581 A | 2/2000 | Umeya | |
| 6,049,428 A | 4/2000 | Khan et al. | |
| 6,067,062 A | 5/2000 | Takasu et al. | |
| 6,067,140 A | 5/2000 | Woo et al. | |
| 6,069,393 A | 5/2000 | Hatanaka et al. | |
| 6,078,378 A | 6/2000 | Lu et al. | |
| 6,087,599 A | 7/2000 | Knowles | |
| 6,133,906 A | 10/2000 | Geaghan | |
| 6,163,313 A | 12/2000 | Aroyan et al. | |
| 6,177,302 B1 | 1/2001 | Yamazaki et al. | |
| 6,181,394 B1 | 1/2001 | Sanelle et al. | |
| 6,184,863 B1 | 2/2001 | Sibert et al. | |
| 6,236,053 B1 | 5/2001 | Shariv | |
| 6,236,063 B1 | 5/2001 | Yamazaki et al. | |
| 6,242,729 B1 | 6/2001 | Izumi et al. | |
| 6,262,408 B1 | 7/2001 | Izumi et al. | |
| 6,278,423 B1 | 8/2001 | Wald et al. | |
| 6,278,444 B1 | 8/2001 | Wilson et al. | |
| 6,284,558 B1 | 9/2001 | Sakamoto | |
| 6,295,113 B1 | 9/2001 | Yang | |
| 6,300,977 B1 * | 10/2001 | Waechter et al. | 348/300 |
| 6,316,790 B1 | 11/2001 | Kodaira et al. | |
| 6,327,376 B1 | 12/2001 | Harkins | |
| 6,351,076 B1 | 2/2002 | Yoshida et al. | |
| 6,351,260 B1 | 2/2002 | Graham et al. | |
| 6,377,249 B1 | 4/2002 | Mumford | |
| 6,380,995 B1 | 4/2002 | Kim | |
| 6,392,254 B1 | 5/2002 | Liu et al. | |
| 6,399,166 B1 | 6/2002 | Khan et al. | |
| 6,441,362 B1 | 8/2002 | Ogawa | |
| 6,465,824 B1 | 10/2002 | Kwasnick et al. | |
| 6,489,631 B2 | 12/2002 | Young et al. | |
| 6,518,561 B1 | 2/2003 | Miura | |
| 6,529,189 B1 | 3/2003 | Colgan et al. | |
| 6,603,867 B1 | 8/2003 | Sugino | |
| 6,681,034 B1 | 1/2004 | Russo | |
| 6,738,031 B2 * | 5/2004 | Young et al. | 345/55 |
| 6,741,655 B1 | 5/2004 | Chang et al. | |

| | | |
|---|---|---|
| 6,762,741 B2 | 7/2004 | Weindorf |
| 6,831,710 B2 | 12/2004 | den Boer |
| 6,862,022 B2 | 3/2005 | Slupe |
| 6,888,528 B2 | 5/2005 | Rai et al. |
| 6,947,102 B2 | 9/2005 | den Boer et al. |
| 6,995,743 B2 | 2/2006 | den Boer et al. |
| 7,006,080 B2 | 2/2006 | Gettemy |
| 7,009,663 B2 | 3/2006 | Abileah et al. |
| 7,023,503 B2 | 4/2006 | den Boer |
| 7,053,967 B2 | 5/2006 | Abileah et al. |
| 7,098,894 B2 | 8/2006 | Yang et al. |
| 7,109,465 B2 | 9/2006 | Kok et al. |
| 7,164,164 B2 | 1/2007 | Nakamura et al. |
| 7,176,905 B2 | 2/2007 | Baharav et al. |
| 7,177,026 B2 | 2/2007 | Perlin |
| 7,184,009 B2 | 2/2007 | Bergquist |
| 7,190,461 B2 | 3/2007 | Han et al. |
| 7,205,988 B2 | 4/2007 | Nakamura et al. |
| 7,208,102 B2 | 4/2007 | Aoki et al. |
| 7,298,367 B2 | 11/2007 | Geaghan et al. |
| 7,348,946 B2 | 3/2008 | Booth, Jr. et al. |
| 7,408,598 B2 | 8/2008 | den Boer et al. |
| 7,450,105 B2 | 11/2008 | Nakamura et al. |
| 7,456,812 B2 | 11/2008 | Smith et al. |
| 7,463,297 B2 | 12/2008 | Yoshida et al. |
| 7,483,005 B2 | 1/2009 | Nakamura et al. |
| 7,522,149 B2 | 4/2009 | Nakamura et al. |
| 7,535,468 B2 | 5/2009 | Uy |
| 7,545,371 B2 | 6/2009 | Nakamura et al. |
| 7,598,949 B2 | 10/2009 | Han |
| 2001/0000676 A1 | 5/2001 | Zhang et al. ................ 349/12 |
| 2001/0046013 A1 | 11/2001 | Noritake et al. |
| 2001/0052597 A1 | 12/2001 | Young et al. |
| 2001/0055008 A1 | 12/2001 | Young et al. |
| 2002/0027164 A1 | 3/2002 | Mault et al. |
| 2002/0030581 A1 | 3/2002 | Janiak et al. |
| 2002/0030768 A1 | 3/2002 | Wu |
| 2002/0052192 A1 | 5/2002 | Yamazaki et al. |
| 2002/0071074 A1 | 6/2002 | Noritake et al. |
| 2002/0074549 A1 | 6/2002 | Park et al. |
| 2002/0126240 A1 | 9/2002 | Seiki et al. |
| 2002/0149571 A1 | 10/2002 | Roberts |
| 2003/0103030 A1 | 6/2003 | Wu |
| 2003/0137494 A1 | 7/2003 | Tulbert |
| 2003/0156087 A1 | 8/2003 | den Boer et al. |
| 2003/0156230 A1 | 8/2003 | den Boer et al. |
| 2003/0179323 A1 | 9/2003 | Abileah et al. |
| 2003/0205662 A1 | 11/2003 | den Boer |
| 2003/0218116 A1 | 11/2003 | den Boer |
| 2004/0046900 A1 | 3/2004 | den Boer et al. |
| 2004/0113877 A1 | 6/2004 | Abileah et al. |
| 2004/0125430 A1 | 7/2004 | Kasajima et al. |
| 2005/0134749 A1 | 6/2005 | Abileah |
| 2005/0285985 A1 | 12/2005 | den Boer et al. |
| 2006/0007224 A1 | 1/2006 | Hayashi et al. |
| 2006/0010658 A1 | 1/2006 | Bigley |
| 2006/0034492 A1 | 2/2006 | Siegel et al. |
| 2006/0125971 A1 | 6/2006 | Abileah et al. |
| 2006/0170658 A1 | 8/2006 | Nakamura et al. |
| 2006/0187367 A1 | 8/2006 | Abileah et al. |
| 2006/0249763 A1* | 11/2006 | Mochizuki et al. ......... 257/291 |
| 2007/0109239 A1 | 5/2007 | den Boer et al. |
| 2007/0109286 A1 | 5/2007 | Nakamura et al. |
| 2007/0216905 A1 | 9/2007 | Han et al. |
| 2007/0279346 A1 | 12/2007 | den Boer et al. |
| 2008/0029691 A1 | 2/2008 | Han |
| 2008/0048995 A1 | 2/2008 | Abileah et al. |
| 2008/0049153 A1 | 2/2008 | Abileah et al. |
| 2008/0049154 A1 | 2/2008 | Abileah et al. |
| 2008/0055295 A1 | 3/2008 | den Boer et al. |
| 2008/0055496 A1 | 3/2008 | Abileah et al. |
| 2008/0055497 A1 | 3/2008 | Abileah et al. |
| 2008/0055498 A1 | 3/2008 | Abileah et al. |
| 2008/0055499 A1 | 3/2008 | den Boer et al. |
| 2008/0055507 A1 | 3/2008 | den Boer et al. |
| 2008/0062156 A1 | 3/2008 | Abileah et al. |
| 2008/0062157 A1 | 3/2008 | Abileah et al. |
| 2008/0062343 A1 | 3/2008 | den Boer et al. |
| 2008/0066972 A1 | 3/2008 | Abileah et al. |
| 2008/0084374 A1 | 4/2008 | Abileah et al. |
| 2008/0111780 A1 | 5/2008 | Abileah et al. |
| 2008/0129909 A1 | 6/2008 | den Boer et al. |
| 2008/0129913 A1 | 6/2008 | den Boer et al. |
| 2008/0129914 A1 | 6/2008 | den Boer et al. |
| 2008/0158172 A1 | 7/2008 | Hotelling et al. |
| 2008/0165311 A1 | 7/2008 | Abileah et al. |
| 2008/0284925 A1 | 11/2008 | Han |
| 2008/0297487 A1 | 12/2008 | Hotelling et al. |
| 2009/0167728 A1 | 7/2009 | Geaghan et al. |
| 2010/0001978 A1 | 1/2010 | Lynch et al. |
| 2010/0013793 A1 | 1/2010 | Abileah et al. |
| 2010/0013794 A1 | 1/2010 | Abileah et al. |
| 2010/0013796 A1 | 1/2010 | Abileah et al. |

FOREIGN PATENT DOCUMENTS

| | | |
|---|---|---|
| DE | 197 20 925 A1 | 12/1997 |
| EP | 0 426 362 A2 | 5/1991 |
| EP | 0 426 362 A3 | 5/1991 |
| EP | 0 426 469 A2 | 5/1991 |
| EP | 0 426 469 A3 | 5/1991 |
| EP | 0 464 908 B1 | 1/1992 |
| EP | 0 488 455 B1 | 6/1992 |
| EP | 0 490 683 B1 | 6/1992 |
| EP | 0 491 436 B1 | 9/1992 |
| EP | 0 509 589 B1 | 10/1992 |
| EP | 0 545 709 B1 | 6/1993 |
| EP | 0 572 009 | 12/1993 |
| EP | 0 572 009 A1 | 12/1993 |
| EP | 0 572 182 | 12/1993 |
| EP | 0 572 182 B1 | 12/1993 |
| EP | 0 587 236 B1 | 3/1994 |
| EP | 0 601 837 B1 | 6/1994 |
| EP | 0 618 527 | 10/1994 |
| EP | 0 633 542 B1 | 1/1995 |
| EP | 0 770 971 A2 | 10/1995 |
| EP | 0 770 971 A3 | 10/1995 |
| EP | 0 366 913 B1 | 11/1995 |
| EP | 0 384 509 B1 | 5/1997 |
| EP | 0 618 527 B1 | 9/1999 |
| EP | 1128170 A | 8/2001 |
| JP | 64-40004 | 2/1989 |
| JP | 1196620 | 8/1989 |
| JP | 2211421 | 8/1990 |
| JP | 5019233 | 1/1993 |
| JP | 5173707 | 7/1993 |
| JP | 9185457 | 12/1995 |
| JP | 8166849 | 6/1996 |
| JP | 91279 | 1/1997 |
| JP | 9231002 | 9/1997 |
| JP | 9274537 | 10/1997 |
| JP | 10027068 | 1/1998 |
| JP | 10040004 | 2/1998 |
| JP | 10133817 | 5/1998 |
| JP | 10133819 | 5/1998 |
| JP | 10186136 | 7/1998 |
| JP | 10198515 | 7/1998 |
| JP | 11-110110 | 4/1999 |
| JP | 11110110 | 4/1999 |
| JP | 11242562 | 9/1999 |
| JP | 2000-020241 | 1/2000 |
| JP | 200002041 | 1/2000 |
| WO | WO 99/21160 | 4/1999 |
| WO | WO-2006/104214 | 10/2006 |
| WO | WO-2007/145346 | 12/2007 |
| WO | WO-2007/145347 | 12/2007 |

| WO | WO-2008/018201 | 2/2008 |
| WO | WO-2008/044368 | 4/2008 |
| WO | WO-2008/044369 | 4/2008 |
| WO | WO-2008/044370 | 4/2008 |
| WO | WO-2008/044371 | 4/2008 |
| WO | WO-2008/047677 | 4/2008 |
| WO | WO-2009/081810 | 7/2009 |

OTHER PUBLICATIONS

Y. Bobrov et al., "5.2 Manufacturing of a Thin-film LCD," Optiva, Inc., San Francisco, CA. 4 pages.

W. den Boer et al. (2003) "Active Matrix LCD with Integrated Optical Touch Screen"; SID'03 (Baltimore) p. 1494-1497.

A. Abileah et al. (2004) "Integrated optical Touch Panel in a 14.1" AMLCD"; SID'04 (Seattle) p. 1544-1547.

A. Abileah et al. (2006) "Optical Sensors Embedded within AMLCD panel: Design and Applications"; ADEAC'06, SID (Atlanta) p. 102-105.

A. Abileah et al. (2007) "Optical Sensors Embedded within AMLCD Panel: Design and Applications"; Siggraph-07, San Diego, 5 pages.

C. Brown et al. (2007) "A 2.6 inch VGA LCD with Optical Input Function using a 1-Transistor Active-Pixel Sensor"; ISSCC 2007 (&7.2) p. 132-133, 592.

S. Hong et al. (2005) "Smart LCD using a-Si photo sensor"; IMID'05 Digest p. 280-283.

International Search Report mailed Apr. 14, 2003 directed to Int'l Application No. PCT/US02/25573; 2 pages.

IPRP and Written Opinion mailed Dec. 30, 2004, directed to Int'l Application No. PCT/US02/25573; 16 pages.

International Search Report mailed Jun. 16, 2003, directed to Int'l Application No. PCT/US03/05300; 2 pages.

IPRP and Written Opinion mailed Oct. 8, 2004, directed to Int'l Application No. PCT/US03/05300; 15 pages.

International Search Report mailed Sep. 21, 2007, directed to Int'l Application No. PCT/US06/43741; 1 page.

IPRP and Written Opinion mailed Sep. 21, 2007, directed to Int'l Application No. PCT/US06/43741; 4 pages.

U.S. Appl. No. 60/359,263, filed Feb. 20, 2002.

U.S. Appl. No. 60/383,040, filed May 23, 2002.

U.S. Appl. No. 60/736,708, filed Nov. 14, 2005.

U.S. Appl. No. 60/821,325, filed Aug. 3, 2006.

Abileah et al., U.S. Office Action mailed Nov. 23, 2009, directed to U.S. Appl. No. 11/407,545 (6 pages).

den Boer, U.S. Office Action mailed Oct. 31, 2007, directed to U.S. Appl. No. 10/217,798 (10 pages).

den Boer, U.S. Office Action mailed Jun. 29, 2007, directed to U.S. Appl. No. 10/217,798 (11 pages)

den Boer, U.S. Office Action mailed May 12, 2006, directed to U.S. Appl. No. 10/217,798 (8 pages).

den Boer, U.S. Office Action mailed Jan. 13, 2006, directed to U.S. Appl. No. 10/217,798 (9 pages).

den Boer, U.S. Office Action mailed Aug. 23, 2005, directed to U.S. Appl. No. 10/217,798 (10 pages).

den Boer, U.S. Office Action mailed Dec. 10, 2004, directed to U.S. Appl. No. 10/217,798 (10 pages).

den Boer, U.S. Office Action mailed Mar. 4, 2004, directed to U.S. Appl. No. 10/217,798 (17 pages).

den Boer, U.S. Office Action mailed Jun. 4, 2003, directed to U.S. Appl. No. 10/217,798 (17 pages).

den Boer, U.S. Office Action mailed Nov. 26, 2004, directed to U.S. Appl. No. 10/307,106 (9 pages).

den Boer, U.S. Office Action mailed Jan. 21, 2005, directed to U.S. Appl. No. 10/329,217 (13 pages).

den Boer, U.S. Office Action mailed May 21, 2004, directed to U.S. Appl. No. 10/329,217 (14 pages).

den Boer et al, U.S. Office Action mailed Feb. 25, 2008 directed to U.S. Appl. No. 11/137,753 (16 pages).

den Boer et al, U.S. Office Action mailed May 23, 2007 directed to U.S. Appl. No. 11/137,753 (12 pages).

Abileah et al., U.S. Office Action mailed Aug. 9, 2005, directed to U.S. Appl. No. 10/442,433 (13 pages).

Abileah et al., U.S. Office Action mailed Sep. 21, 2004, directed to U.S. Appl. No. 10/442,433 (7 pages).

Abileah et al., U.S. Office Action mailed Aug. 28, 2006, directed to U.S. Appl. No. 10/371,413 (7 pages).

Abileah et al., U.S. Office Action mailed Dec. 13, 2005, directed to U.S. Appl. No. 10/371,413 (7 pages).

Abileah et al., U.S. Office Action mailed Apr. 15, 2005, directed to U.S. Appl. No. 10/371,413 (5 pages).

Abileah et al., U.S. Office Action mailed Jul. 12, 2005, directed to U.S. Appl. No. 10/347,149 (4 pages).

Abileah et al., U.S. Office Action mailed Jan. 21, 2005, directed to U.S. Appl. No. 10/347,149 (10 pages).

Abileah et al., U.S. Office Action mailed Jun. 22, 2005, directed to U.S. Appl. No. 10/739,455 (11 pages).

Abileah et al., U.S. Office Action mailed Mar. 24, 2009, directed to U.S. Appl. No. 11/351,098 (11 pages).

Abileah et al., U.S. Office Action mailed Jun. 24, 2008, directed to U.S. Appl. No. 11/351,098 (12 pages).

Abileah et al., U.S. Office Action mailed Oct. 18, 2007, directed to U.S. Appl. No. 11/351,098 (6 pages).

Abileah et al., U.S. Office Action mailed Jun. 28, 2007, directed to U.S. Appl. No. 11/351,098 (13 pages).

den Boer et al., U.S. Office Action mailed Jun. 25, 2009, directed to U.S. Appl. No. 11/980,029 (10 pages).

International Search Report for PCT/US03/03277; dated Nov. 11, 2003.

Muncaki Yamaguchi et al., "Two-dimensional Contact-Type Image Sensor Using Amorphous Silicon Photo-Transistor", Jpn. J. Appl. Phys. vol. 32, pp. 458-461, Jan. 1993.

Jeong Hyun Kim et al., "Fingerprint Scanner Using a-Si: H TFT-array", SID '00 Digest, May 14, 2000.

Echtler et al., (Jan. 2010) "An LED-based Multitouch Sensor for LCD Screens," Cambridge, Massachusetts: ACM; 4 pages.

Rossiter et al., (2005) "A Novel Tactile Sensor Using a Matrix of LEDs Operating in Both Photoemitter and Photodetector Modes," IEEE: 994-997.

Anita Kis, "Tactile Sensing and Analogic Algorithms," Ph.D. Dissertation, Budapest 2006; 122 pages.

*Top Touch-Screen Options*, from the web site of Industrial Technology (www.industrialtechnology.co.uk/2001/mar/touch.html), dated Oct. 29, 2001, 2 pages.

\* cited by examiner

Photocurrent and Dark Current vs Gate Voltage (Vbias1) at Vds = (Vbias1) + 5V for a-Si TFT with W/L = 200 um/6 um

IMAGE SENSOR WITH PHOTOSENSITIVE THIN FILM TRANSISTORS

TECHNICAL FIELD

This application relates to image sensors and, more specifically, to flat panel image sensors employing photosensitive thin film transistors.

BACKGROUND OF THE INVENTION

Flat panel image sensors are commercially successful products that are able to effectively detect electromagnetic radiation in and near the visible light spectrum. Flat panel image sensors are fabricated by depositing and patterning various metals, insulators, and semiconductors on glass substrates as is done in flat panel displays. Such sensors commonly employ photosensitive elements, such as amorphous silicon (a-Si) PIN diodes. The photosensitive element is coupled to a readout switch, such as thin film transistor (TFT), that provides data indicative of received light.

A common use for flat panel image sensors is for medical and industrial applications to detect x-rays. The image sensor includes a phosphorescent screen that overlays an array of image sensing elements. The phosphorescent screen converts received x-rays to visible light. The array receives the visible light and generates a photocurrent responsive to the light. The photocurrent is read out as data indicative of the sensed light.

The arrays are difficult to manufacture since separate process steps are required to construct the PIN diodes and the TFTs. The total mask count may be 8 or more which is burdensome while the yields are low. Furthermore, a-Si PIN diodes are not a standard device in flat panel display processing which increases manufacturing expense. It would therefore be advantageous to use a standard process to greatly reduce the cost of flat panel image sensors.

Manufacturing TFTs for flat panel display applications is a common process. A common use for TFTs is in active matrix liquid crystal displays (AMLCDs). Each TFT functions as a switch for a pixel in a matrix display. The voltage across each pixel is controlled independently and at a high contrast ratio. TFTs may be fabricated by depositing and patterning metals, insulators, and semiconductors on substrates through methods well known in the art. TFTs typically employ a-Si, polycrystalline silicon, or CdSe film as the semiconductor material. A-Si is typically used in flat panel display applications as it is easily deposited on large area glass substrates at temperatures below 350 centigrade.

TFTs are more economical to fabricate than a-Si PIN diodes and are well suited for flat panel applications. The present inventors have recognized that if both the image sensing element and the readout switch of an image sensor array were incorporated as TFTs, fewer photomasks would be required and manufacturing costs would be greatly reduced.

TFTs have not typically been used as photosensitive elements. U.S. Patent Application Publication Nos. 2001/0055008 and 2001/0052597, both to Young et al. (hereinafter the "Young applications") disclose the use of TFTs as light sensing elements for an emissive display device. The light sensing elements provide feedback to progressively adjust the current flow through display elements to control light output. However, the use of TFTs exclusively for an image sensor is not disclosed. Since a TFT is more economical to manufacture and has already been successfully incorporated into flat panel applications, the present inventors have recognized that it would be advantageous to employ TFTs in image sensors.

Other applications disclose detecting light reflected through a transparent sensor element incorporating a TFT. J. H. Kim et al., "Fingerprint Scanner Using a-Si:H TFT array," SID '00 Digest, Long Beach, Calif., USA, pp. 353-355 discloses a contact image sensor that requires a transparent sensor element to pass reflected light. M. Yamaguchi et al., "Two-Dimensional Contact-Type Image Sensor Using Amorphous Silicon Photo-Transistor," Jpn. J. Appl. Phys., Vol. 32 (1993) pp. 458-461 discloses an image sensor that passes reflected light through a transparent sensor element and also receives direct light.

Conventional image sensing applications have not considered the use of TFTs to detect relatively weak x-ray emissions. In order to detect x-ray emissions, the sensitivity of the imaging sensing TFT is a primary concern. Conventional devices are unable to provide adequate light detection for x-ray applications. Transparent pixels, in particular, do not provide sufficient sensor element density to detect light resulting from x-ray emissions. Thus, it would be an advancement in the art to provide a TFT image sensor with enhanced light detection capability and suitable for x-ray applications. Such a device is disclosed and claimed herein.

SUMMARY OF THE INVENTION

An image sensor array includes photo sensors disposed on a substrate and arranged to receive and sense an image. Each photo sensor represents a pixel for a received image. The photo sensors each include a photo TFT that generates a photocurrent in response to the image. The photo TFT may be manufactured using common processes for TFTs in flat panel applications. The photo TFT has a gate electrode which is shorted to its source electrode to obtain a photocurrent that is substantially independent of source-drain bias. The photo TFT may also be configured with interdigitated source and drain electrodes to increase the photosensitivity. Each photo TFT is coupled to a bias line to enable operation and a storage capacitor to store a charge and discharge upon generation of a photocurrent.

In an alternative embodiment, a photo TFT has its source electrode and gate electrode coupled to independent bias lines to reduce the effect of dark current. The corresponding storage capacitor is coupled to the source and drain electrodes.

In yet another alternative embodiment, a photo TFT has its gate electrode coupled to a bias line and its source electrode coupled to a select line of an adjacent sensor element. The corresponding storage capacitor is coupled to the gate and drain electrodes.

In a further alternative embodiment, the photo TFT may be disposed above the storage capacitor in stacked configuration. In this implementation, the surface area of the photo TFT may be increased to yield greater light detection capability. The storage capacitor may also be enlarged for greater capacitance.

The storage capacitor is preferably coupled to a readout TFT that is also manufactured using known processes. The readout TFT passes a charge from the storage capacitor to a data line. Operation of the readout TFT is enabled by a select line which is coupled to the gate electrode of the readout TFT. A light shield may be disposed over the channel of the readout TFT to prevent a charge leaking through the readout TFT.

Each photo TFT may be coupled to a reference TFT. A reference TFT is similar in structure to a corresponding photo TFT and provides an equivalent dark current to compensate for dark current in the photo TFT. The reference TFT includes a light shield so as to not generate a photocurrent in response to received light.

The photo TFTs can provide an effective and economical alternative to conventional photodiodes. Photo TFTs may be manufactured concurrently with the manufacture of corresponding readout TFTs using conventional methods, thereby reducing mask counts and costs. Photo TFTs may further yield photocurrents greater than that of photodiodes. Furthermore, photo TFTs have a lower fill factor and provide less spillover to adjacent pixels.

Additional aspects and advantages of this invention will be apparent from the following detailed description of preferred embodiments thereof, which proceeds with reference to the accompanying drawings.

BRIEF DESCRIPTION OF THE DRAWINGS

Non-exhaustive embodiments are described with reference to the figures in which.

DETAILED DESCRIPTION OF PREFERRED EMBODIMENTS

Figure 1A:
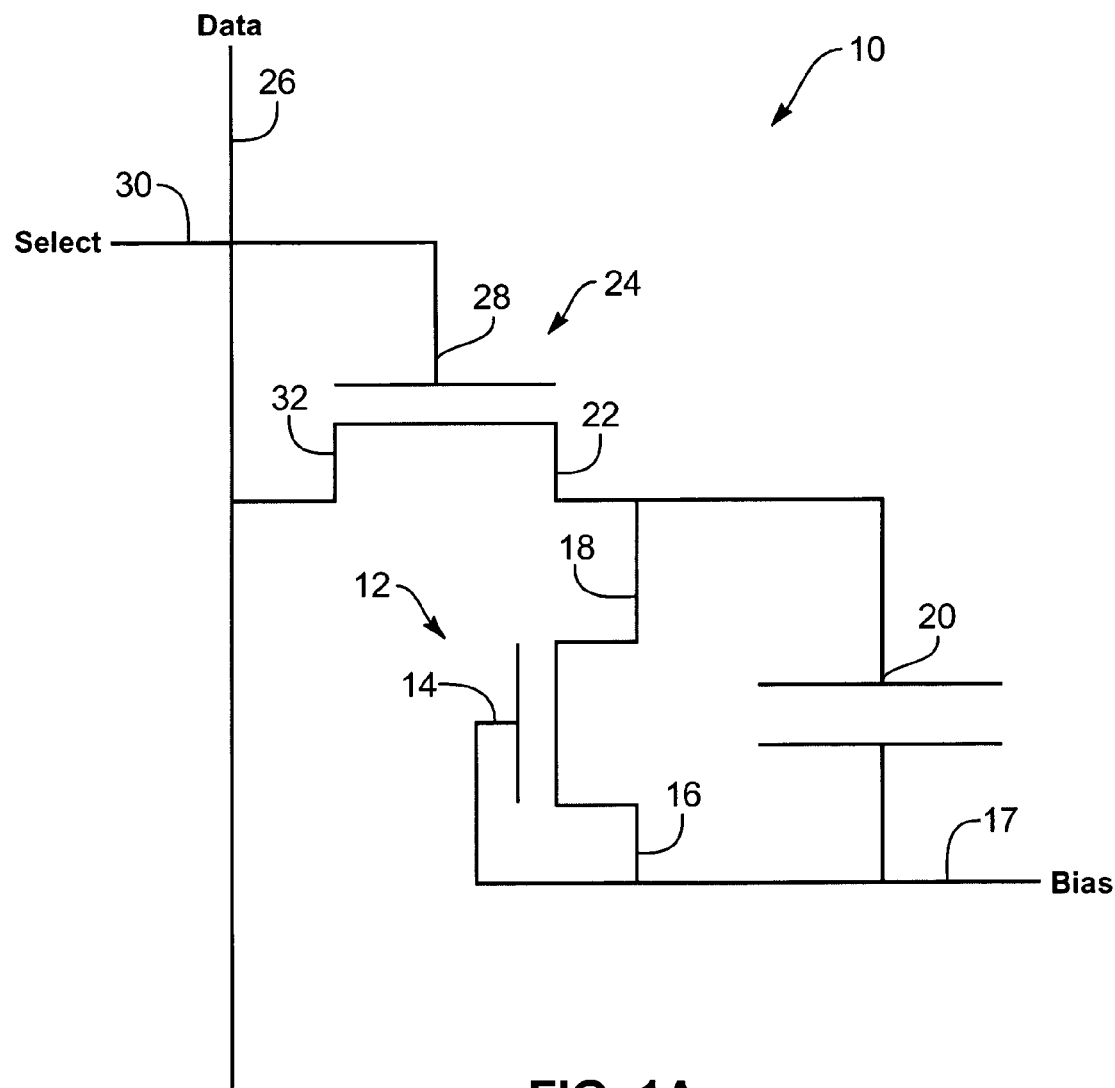
FIG. 1A is a schematic diagram of an embodiment of a sensor element.

Reference is now made to, the figures in which like reference numerals refer to like elements. For clarity, the first digit or digits of a reference numeral indicates the figure number in which the corresponding element is first used.

Throughout the specification, reference to "one embodiment" or "an embodiment" means that a particular described feature, structure, or characteristic is included in at least one embodiment of the present invention. Thus, appearances of the phrases "in one embodiment" or "in an embodiment" in various places throughout this specification are not necessarily all referring to the same embodiment.

Furthermore, the described features, structures, or characteristics may be combined in any suitable manner in one or more embodiments. Those skilled in the art will recognize that the invention can be practiced without one or more of the specific details, or with other methods, components, materials, etc. In other instances, well-known structures, materials, or operations are not shown or not described in detail to avoid obscuring aspects of the invention.

Referring to FIG. 1A, an embodiment of a sensor element 10 is shown suitable for use in an image sensor matrix array. The sensor element 10 includes a photo TFT 12 that generates a photocurrent in response to received light. The photo TFT 12 is easily fabricated using common thin film layers. In the embodiment shown, the photo TFT 12 is a gated device having similarly doped contact regions and an intrinsic semiconductor region disposed between. The photo TFT 12 has a gate electrode 14 that is coupled directly to the source electrode 16. The coupling of the gate and source electrodes 14, 16 creates a generated photocurrent that, for short channel lengths, exceeds that of an a-Si PIN photodiode. The photocurrent is a secondary photocurrent and has a potential gain of more than one whereas an a-Si PIN photodiode typically has a gain of less than one. The source electrode 16 is coupled to a bias line 17 which is common to all photosensitive elements in an array. In operation, the bias line 17 may be coupled to a negative voltage.

The source and drain electrodes 16, 18 of the photo TFT 12 are coupled to a storage capacitor 20 which is discharged when the photo TFT 12 is exposed to light. The storage capacitor 20 is coupled to the source electrode 22 of a readout TFT 24. The charge on the storage capacitor 20 is read out periodically through the readout TFT 24 and a data line 26. As shown, the gate electrode 28 of the readout TFT 24 is coupled to a select line 30 to enable the readout TFT 24. A drain electrode 32 is coupled to the data line 26 to readout a charge.

The photo TFT 12 and the readout TFT 24 may be manufactured using common TFT manufacturing methods, such as in AMLCD applications. The TFTs 12, 24 generally include substantially co-planar source and drain electrodes, a semiconductor layer between the source and drain electrodes, and a gate electrode in proximity to the semiconductor layer but electrically insulated by a gate insulator. Current flow between the source and drain electrodes is controlled by the application of a voltage to the gate electrode. The voltage to the gate electrode produces an electric field which accumulates a charged region near the semiconductor-gate insulator interface. This charged region forms a current conducting channel in the semiconductor layer through which the device current is conducted.

Figure 1B:
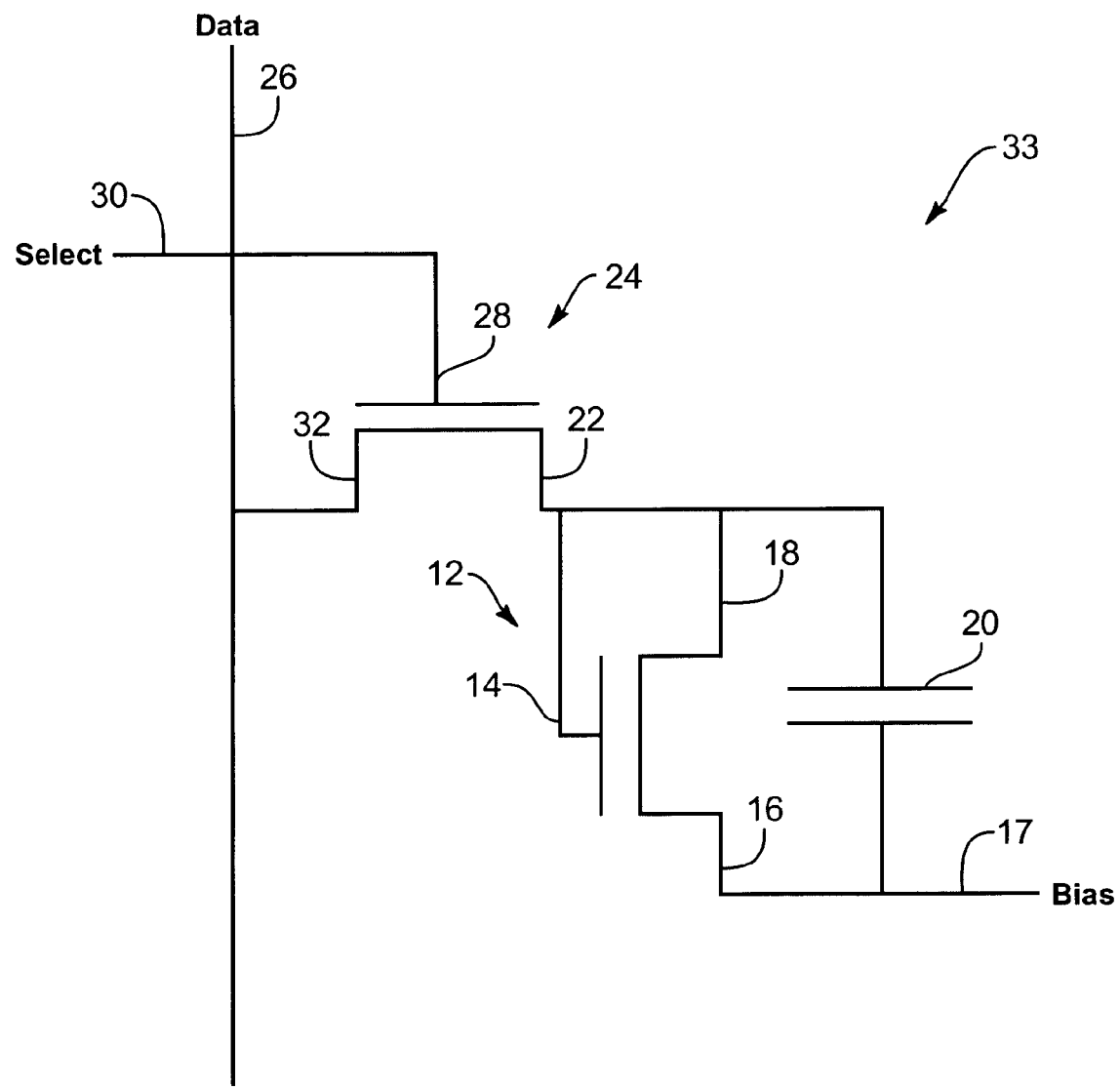
FIG. 1B is a schematic diagram of an alternative embodiment of a sensor element.

Referring to FIG. 1B an alternative embodiment of a sensor element 33 is shown. The sensor element 33 differs from the previously shown embodiment in that the gate electrode 14 is coupled directly to the drain electrode 18. In operation, the bias line 17 has a positive voltage bias. Operation of the sensor element 33 is similar to that of sensor element 10. The storage capacitor 20 is discharged when the photo TFT 12 is exposed to light. The charge on the storage capacitor 20 is read out periodically through the readout TFT 24 and the data line 26.

Figure 2:
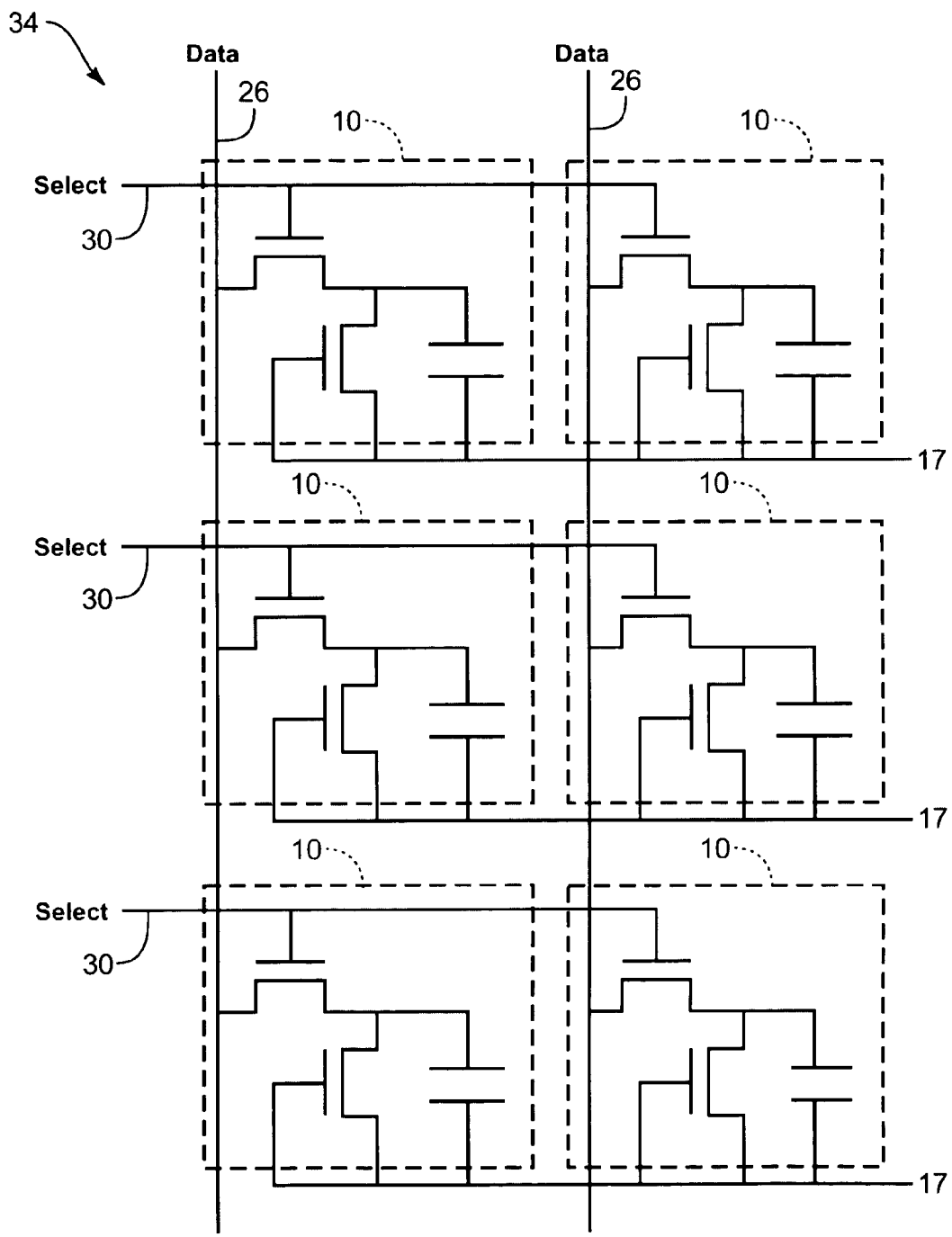
FIG. 2 is a schematic diagram of an array of sensor elements.

Referring to FIG. 2, a schematic is shown of an image sensor array 34 that includes regularly-spaced sensor elements 10 of FIG. 1A. Although elements 10 of FIG. 1A are shown, sensor elements of FIG. 1B may be used as well. The sensor elements 10 are arranged at intersections between rows and columns with each element corresponding to an individual pixel. The rows are designated by the select lines 30 and the columns are designated by the data lines 26. Individual sensor elements respond to received light and generate a data signal that is transmitted on an associated data line 26. As data signals pass through the data lines 26 to a readout circuit, an image sensor array 34 determines the location of a received image on the array 34.

The array 34 is for illustrative purposes only as an image sensor would have far more sensor elements. The select lines 30 may be in communication with an address circuit to address individual readout TFTs.

Figure 3:
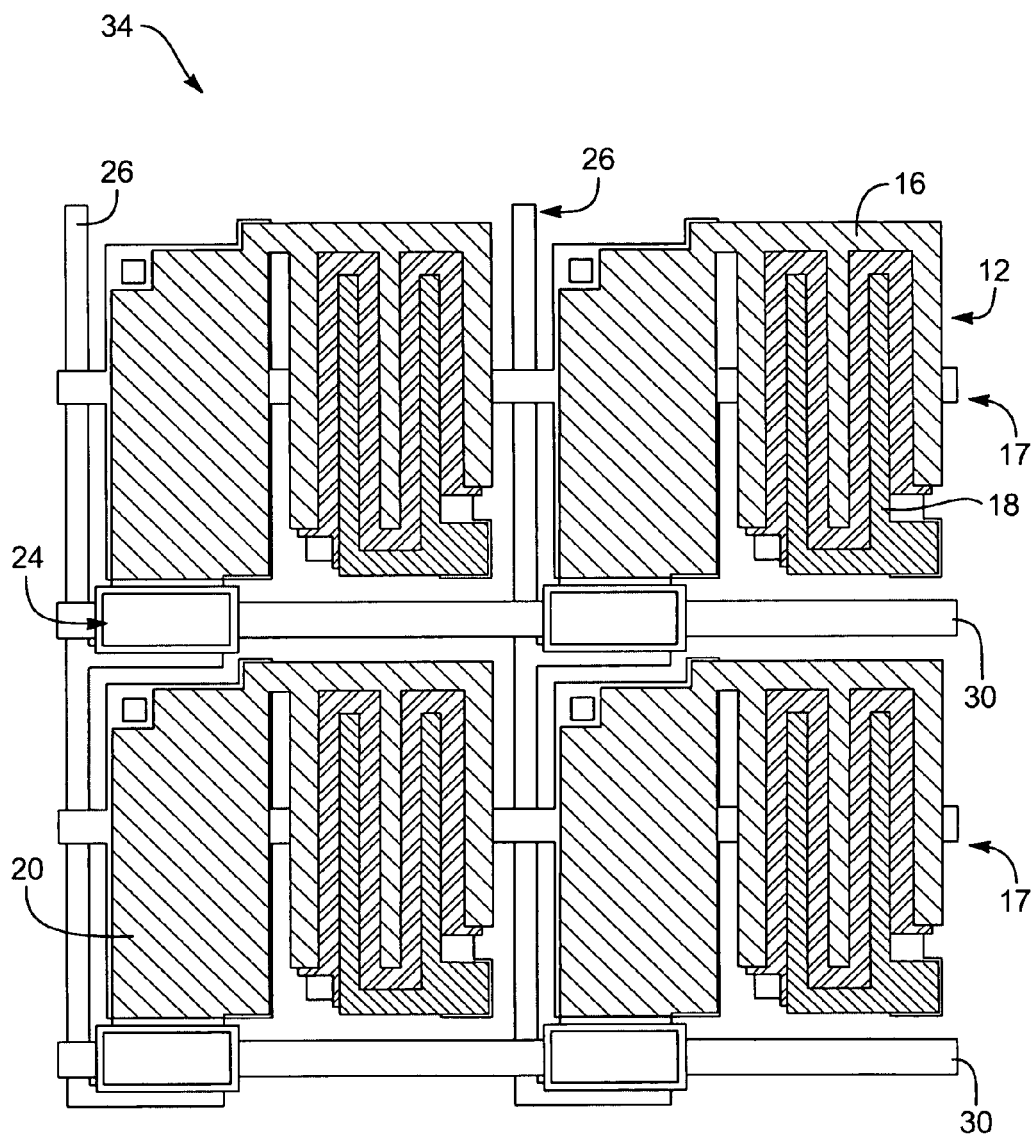
FIG. 3 is a plan view of an embodiment of sensor elements for use in an image sensor array.

Referring to FIG. 3, a plan view of four sensor elements 10 is shown. The photo and readout TFTs 12, 24 may be embodied as various structures which may be manufactured using processes similar to that for TFTs in an AMLCD. The plan view provides a view of components relative to one another. As shown, the photo TFT 12 has a drain electrode 16 and a source electrode 18 configured with extending members. The extending members are disposed relative to one another to form an interdigitated pattern.

Figure 4:
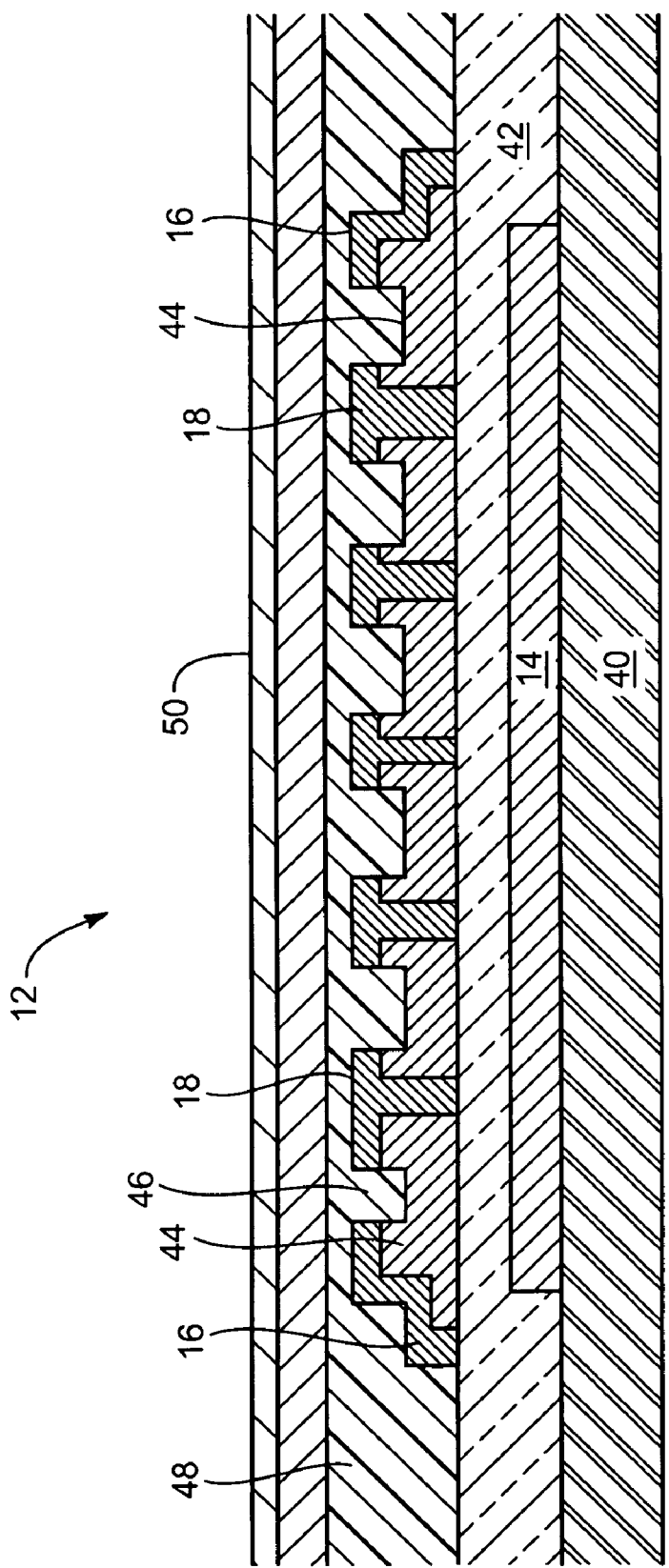
FIG. 4 is a cross-sectional view of one embodiment of a photo TFT.

Referring to FIG. 4, a cross-sectional view of one embodiment of a photo TFT 12 of FIG. 3 is shown. The photo TFT 12 may be used in either sensor elements 10, 33 of FIG. 1A or 1B. The photo TFT 12 includes a gate electrode 14 deposited and patterned on an insulating transparent substrate 40, such as glass, quartz, sapphire, or the like. The gate electrode 14 may include metals such as Cr, Cu, Al, Ta, Ti or the like. A gate insulator 42 insulates the gate electrode 14 from a semiconductor layer 44. The gate insulator 42 may include various materials well known in the art, such as silicon nitride, silicon oxide, or the like.

A semiconductor layer 44 is stacked on the gate insulator 42 above the gate electrode 14 and may include a-Si, p-Si, amorphous silicon carbide (SiC), tellurium (Te), selenium (Se), cadmium sulfide (CdS), cadmium selenide (CdSe), or the like. However, a-Si is well suited to large area fabrication on glass substrates at temperatures below 350 centigrade and exhibits a very high, dark resistivity. The semiconductor layer 44 may be deposited in accordance with methods known in the art including sputtering or deposition, such as plasma-enhanced chemical vapor deposition. The semiconductor layer 44 may be patterned through known methods, such as by use of a mask and photolithographic processing.

The semiconductor layer 44 may include an n+ layer that contacts the source and drain electrodes 16, 18. The n+ layer may be deposited on opposing ends of the semiconductor layer 44 where contact exists with the source and drain electrodes 16, 18. The n+ layer provides a low resistance contact for the source and drain electrodes 16, 18, and suppresses hole injection at negative gate voltage.

The source and drain electrodes 16, 18 are patterned at a certain distance from one another so that the electrodes 16, 18 are separated by a co-planar region of semiconductor material 44 in order to form a gate controlled current channel. The semiconductor layer 44 may be configured as shown in FIG. 4, to provide contact between alternating source and drain electrode extending members 16, 18. As such, the semiconductor layer 44 and source and drain electrode extending members 16, 18 are patterned and etched to form multiple channels 46. The interdigitated pattern increases the photosensitivity of the photo TFT 12, although one of skill in the art will appreciate that the photo TFT 12 may have an alternative configuration such as a simple inverted staggered structure, trilayer type inverted staggered structure, or other known structures.

In one embodiment, a passivation layer 48 is formed on an upper surface of the photo TFT 12 to cover and protect the channels 46. The passivation layer 48 may include silicon nitride, silicon oxide, and combinations thereof. The passivation layer 48 may extend and cover the electrodes 16, 18 as well.

The present invention has particular application in detecting x-ray emissions in the industrial and medical industries. The photo TFT 12 may be used to detect x-ray emissions by covering the TFT 12 with a screen 50 to convert x-rays to light. The screen 50 includes scintillator material that absorbs x-rays and converts the energy to visible light. Scintillator material may yield many light photons for each received x-ray photon. The scintillator material usually consists of a high-atomic number material, which has high x-ray absorption, and a low-concentration activator that provides direct band transitions to facilitate visible photon emission.

Acceptable scintillator materials include granular like phosphors or crystalline like cesium iodide (CsI). Phosphors glow when exposed to x-rays. Various grain sizes and chemical mixtures may be used to produce a variety of resolution and brightness varieties. CsI provides a better combination of resolution and brightness. Because cesium has a high atomic number, it is an excellent x-ray absorber and is very efficient at converting x-ray to visible light. The scintillator material may be mixed with a glue binder and coated onto plastic sheets to form the screen 50. In one embodiment the scintillator material includes relatively low cost external phosphor such as Kodak® LANEX, which has a $Gd_2O_2S$:Tb layer to convert x-rays to green light with a wavelength of 544 nm.

In operation, the dark current of the photo TFT 12 may be significant and create noise in an image. In order to compensate, the dark image may be stored in a memory and subtracted from the light image. The dark current may also exhibit some drift over time, which affects the gray scale accuracy and image quality. This may be minimized by periodically, e.g. every minute, interrupting the light exposure and retaking the dark reference image.

Figure 5:
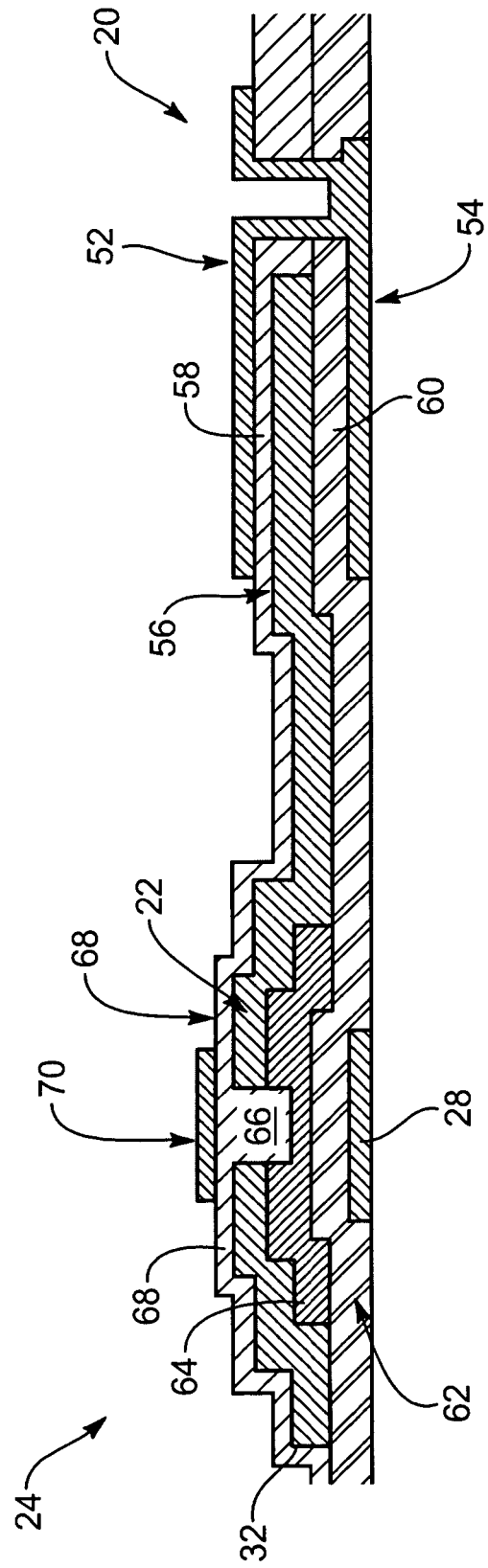
FIG. 5 is a cross-sectional view of one embodiment of a readout TFT and a storage capacitor.

Referring to FIG. 5, a cross-sectional view of an embodiment of a storage capacitor 20 and a readout TFT 24 coupled to one another is shown. The storage capacitor 20 may be embodied as a stacked capacitor having multiple layers and is deposited on a substrate 40. A stacked capacitor increases the dynamic range of the sensor element 10 and requires less space thereby increasing the space available for the photo TFT 12. In one embodiment, the capacitor 20 has a top electrode 52, bottom electrode 54, and a center electrode 56. The center electrode 56 is separated from the top and bottom electrodes 52, 54 by first and second dielectric layers 58, 60. The center electrode 56 may include Al, Cr, Ti, Mo and the like and, in the embodiment shown, couples to the source electrode 22 of the readout TFT 24.

The readout TFT 24 may have a conventional structure and a manufacturing process similar to that of a TFT in an array for an AMLCD. The TFT 24 includes a gate electrode 28 deposited on the upper surface of the insulating substrate 40. The gate electrode 28 may include Cu, Cr, Al, Ta, Ti, or combinations thereof and is deposited through known methods such as sputtering or vapor deposition. The gate electrode may then be patterned by photolithography or other known methods. A gate insulator 62 covers the gate electrode 28 and may include silicon nitride, silicon oxide, tantalum oxide, or combinations thereof. The gate insulator 62 may be the same layer that serves as a dielectric layer 60 for the storage capacitor 20.

A semiconductor layer 64 is deposited on the gate insulator 62 above the gate electrode 28 using known deposition methods. The semiconductor layer 64 may include a-Si, p-Si, or the like and further include a doping layer, such as a n+ layer, that contacts the source and drain electrodes 22, 32. The source and drain electrodes 22, 32 are deposited and patterned using known methods and, with the semiconductor layer 64, form a channel 66.

A passivation layer 68, which may also be the same layer as passivation layer 48, covers and protects the channel 66. The passivation layer 68 may include silicon nitride, silicon oxide, or other suitable dielectric material and may also extend and serve as a dielectric layer 58 for the storage capacitor 20.

In one embodiment, which departs from conventional TFT structures, a light shield 70 may be disposed on the upper surface of the passivation layer 68 to cover the channel 66. The readout TFT 24 may be exposed to the same light level as the photo TFT 12. Shielding prevents a charge from leaking from the storage capacitor 20 through the readout TFT 24. The light shield 70 is opaque and may include Cr or other suitable material. In an alternative embodiment, the light shield 70 may also extend and serve as the top electrode 52 or as an additional electrode for the storage capacitor 20. An additional electrode increases the value of the storage capacitor 20.

Figure 6:
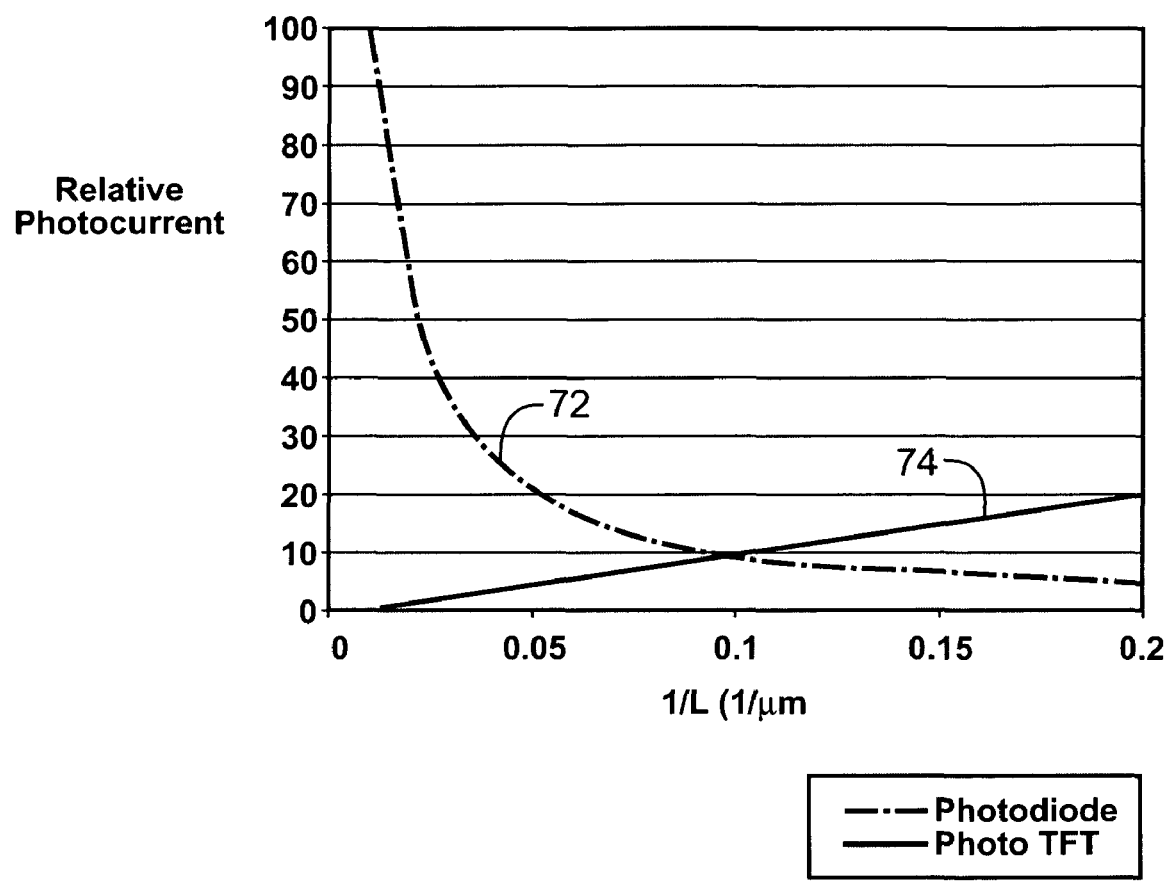
FIG. 6 is a graph comparing the photocurrent for a PIN photodiode with the photocurrent for a photo TFT.

Referring to FIG. 6, a graph is shown illustrating the relative photocurrents of an a-Si photodiode and an a-Si photo TFT as an inverse function of channel length (L). The photo TFT is configured with its gate electrode 14 coupled to its source electrode 16. As illustrated, the resulting photocurrent of the photo TFT exceeds that of the photodiode for certain values of L. In the photodiode, the photocurrent 72 is proportional to the linear dimension L, whereas, in the photo TFT, the photocurrent 74 is proportional to 1/L.

At a certain value of L, which is approximately 10 to 20 μm, the conversion efficiency of photons into current becomes equal for the two devices. For smaller values of L, the photo TFT becomes more efficient. This is because the photocurrent 72 in the photo diode is a primary photocurrent with a gain that cannot exceed unity. One photon generates not more than one electron-hole pair, since the photo diode has blocking contacts for electrons and holes when reverse biased. Therefore, only one charge carrier can contribute to the photocurrent per absorbed photon. In the photo TFT, the source and drain contacts may be embodied as n+ layers so that electrons can be injected from the contacts and replenish the photocurrent. Thus, a secondary electron photocurrent occurs which can have a gain more than 1 when the electron lifetime exceeds the transit time from source to drain.

According to preferred embodiments, there is provided an image sensor array having a substrate with addressable pixels. Each pixel defined by a sensor element 10 has a photo TFT 12, storage capacitor 20, and a readout TFT. Each sensor element 10 is in electrical communication with a control circuit (not shown) to operate the sensor elements. The photo TFT 12 includes a doped semiconductor material that generates a current channel in response to received light and effectively discharges the storage capacitor 20.

TFT manufacturing for flat panel applications is a standard process which reduces the cost of the image sensor. Whereas PIN diodes and TFTs require separate processes to manufacture and can require 8 or more photomasks, an image sensor in accordance with the embodiments described herein can be constructed with 3 to 5 photomasks. A photo TFT can yield photocurrents that exceed that of a PIN diode.

Although the photocurrent of a photo TFT can be an order of magnitude greater than a PIN diode, the dark current of a photo TFT can also be much greater than that of a PIN diode. Even when a photo TFT is operated in complete darkness a small current is still present which is referred to as a dark current. A relatively small amount of energy is sufficient to overcome the relatively low threshold of a photo TFT and create a dark current. A dark current may result from thermal activity, screen scintillation, field emission, and other forms of noise. A high dark current limits the dynamic range of a sensor and can potentially increase the noise at the low light levels used in x-ray radiography and fluoroscopy.

Figure 7:
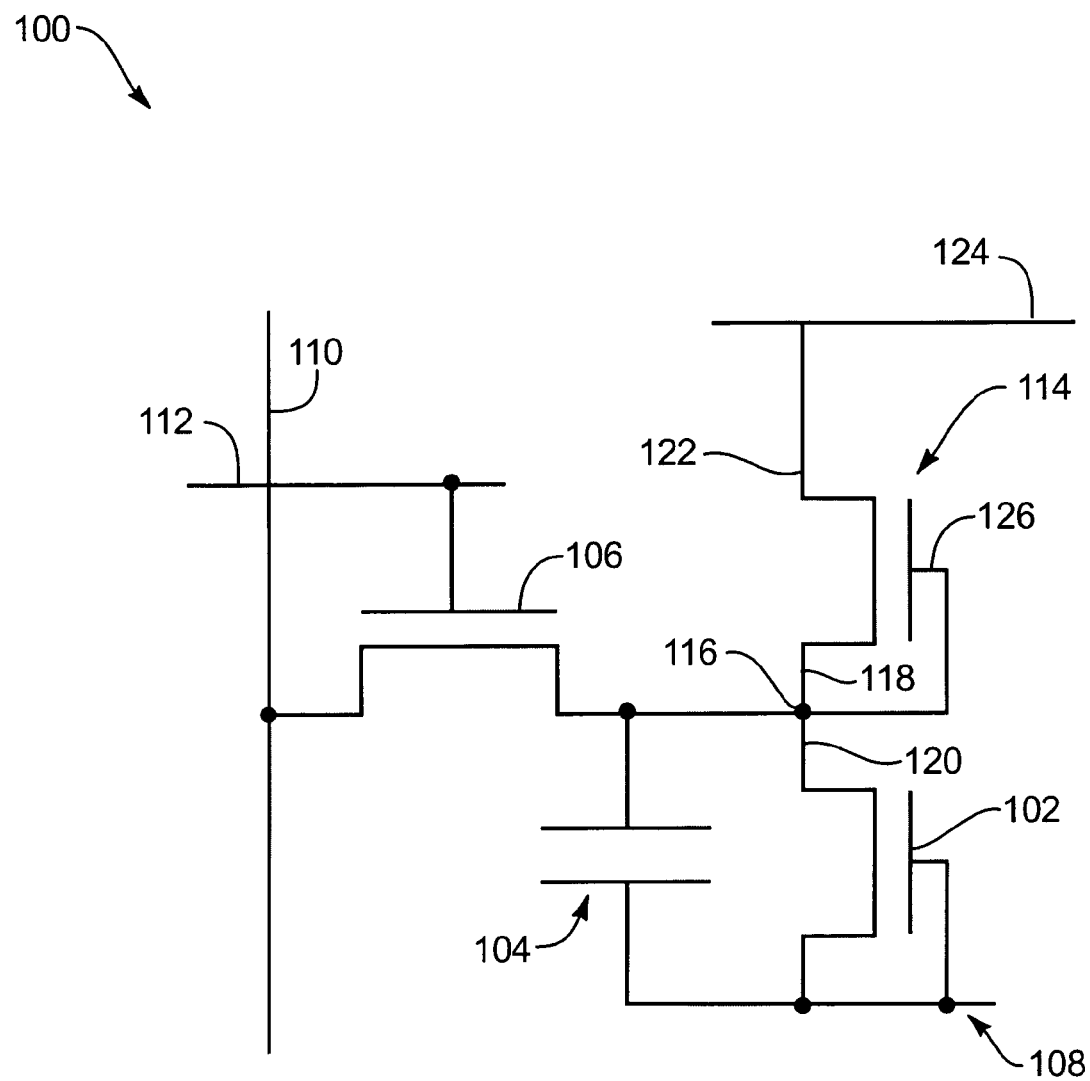
FIG. 7 is a schematic diagram of an alternative embodiment of a sensor element.

Referring to FIG. 7, an embodiment of a sensor element 100 for use in an image sensor matrix array is shown. The sensor element 100 includes elements of the embodiment of FIG. 1A such as a photo TFT 102 coupled to a storage capacitor 104 and a readout TFT 106. Structure and operation of the capacitor 104 and TFTs 102, 106 is similar to that previously described above. The sensor element 100 is coupled to a bias line 108, data line 110, and select line 112 as shown.

The sensor element 100 further includes a dark current reference TFT 114 that is coupled to the photo TFT 102 at a pixel node 116. The drain 120 of the photo TFT 102 is connected to the source 118 of the reference TFT 114. The pixel node 116 has a voltage, referred to herein as the signal voltage, which is held by the storage capacitor 104 and is read out through the readout TFT 106 once per frame.

The reference TFT 114 cancels dark current resulting from the photo TFT 102 and is coupled at its source electrode 122 to a second bias line 124. A gate electrode 126 of the reference TFT 114 is coupled to the pixel node 116 but may also be coupled to the second bias line 124 in an alternative implementation. The reference TFT 114 may be shielded with an opaque light shield similar to the readout TFT 24 of the previous embodiments. The readout TFT 106 may also be so shielded to prevent a charge from leaking from the storage capacitor 104 through the readout TFT 106.

The reference TFT 114 and the photo TFT 102 have substantially identical dimensions other than the aforementioned light shield. Because the reference TFT 114 and the photo TFT 102 are very similar and in close proximity, process variations across the sensor element 100 are not an issue. The TFTs 102, 114 will generate the same or very similar dark current.

The first and second bias lines 108, 124 have separate bias voltages. The voltage at node 116 is reset to the charge amplifier reference voltage, $V_{ref}$, during each readout. Thus, the voltage on line 108 is typically 5 to 10 V lower than $V_{ref}$ and the voltage on line 124 is higher by substantially the same amount. Hence, the bias voltage across both the reference TFT 114 and the photo TFT 102 will remain approximately the same in the dark. In one implementation, when a charge amplifier reference voltage is 5V, the first bias voltage may be 0 V and the second bias voltage may be 10 V.

The first and second bias lines 108, 124 have separate bias voltages. Although any number of bias voltages may be suitable, the first bias voltage 108 is typically smaller than the second bias voltage 124. In one implementation, the first bias voltage may be 0 V and the second bias voltage may be 10 V.

When the sensor element 100 is not exposed to light, the signal voltage at the pixel node 116 does not change. This is because the dark currents of the photo TFT 102 and reference TFT 114 are approximately equal to one another and effectively cancel out. The signal voltage at the pixel node 116 holds the differential voltage between the photocurrent and the dark current. Thus, the dark current is subtracted at the pixel node 116.

When the sensor element 100 is exposed to light, the photo TFT 102 will have a larger photocurrent than the reference TFT 114 which is shielded from the light. The storage capacitor 104 will discharge and provide a read out.

When the dark currents of the photo TFT 102 and the reference TFT 114 are within ten percent, the dynamic range of the sensor element will increase by a factor of ten. Similarly, when the dark currents vary by less than 1 percent, the dynamic range will increase by about a factor of 100.

Figure 8:
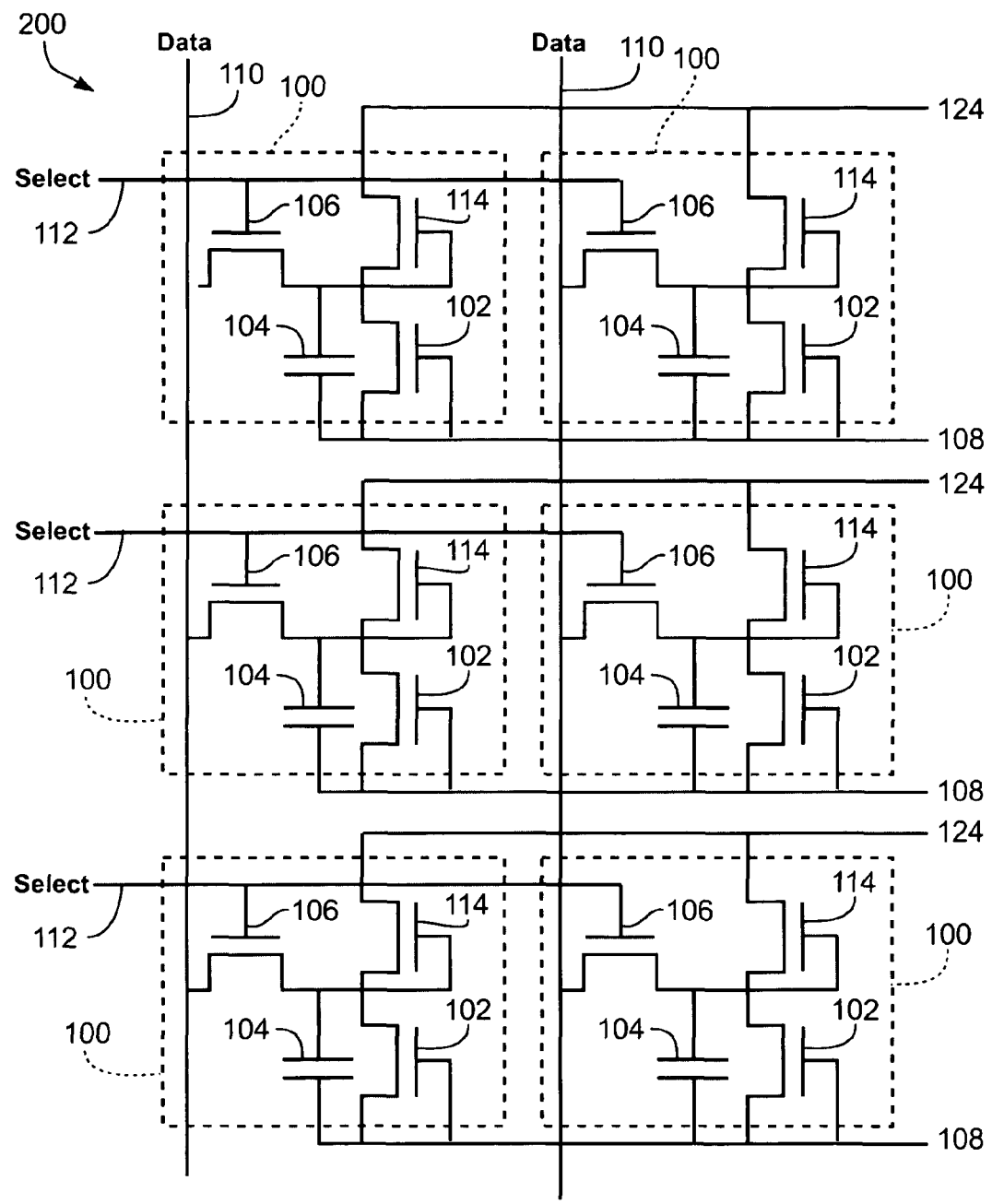
FIG. 8 is a schematic diagram of an alternative embodiment of an array of sensor elements.

Referring to FIG. 8, a schematic is shown of an image sensor array 200 that includes six regularly-spaced sensor elements 100 of FIG. 7. The sensor elements 100 are arranged at intersections between rows and columns with each element corresponding to an individual pixel. The rows are designated by the select lines 112 and the columns are designated by the data lines 110. Individual sensor elements 100 respond to received light and generate a data signal that is transmitted on an associated data line 110. The voltage bias lines 108, 124 are coupled to their respective TFTs 102, 114.

Figure 9:
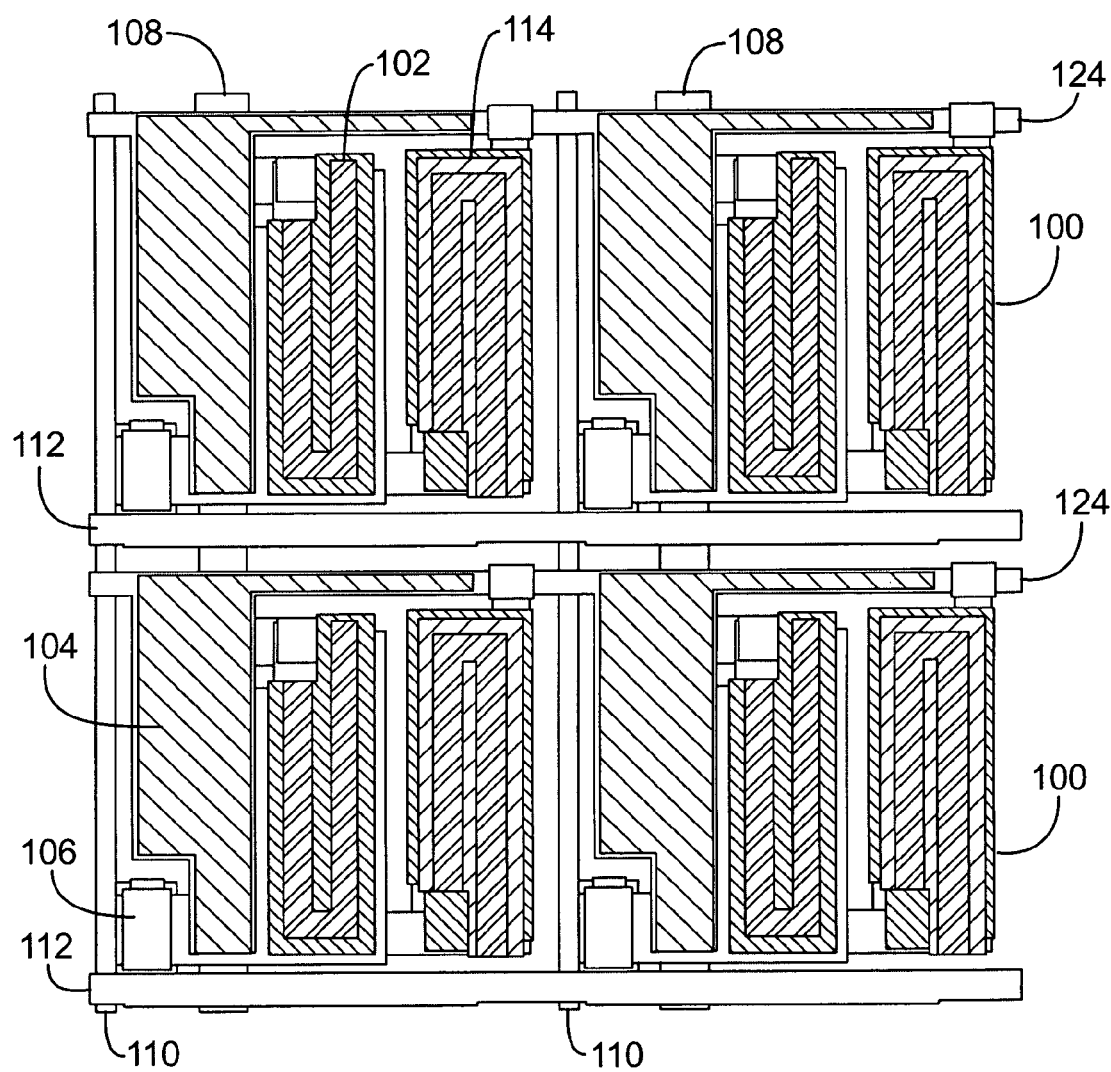
FIG. 9 is a plan view of an embodiment of sensor elements for use in an image sensor array.

Referring to FIG. 9, a plan view of four sensor elements 100 is shown. The sensor elements 100 are shown coupled to the first and second bias lines 108, 124, select lines 112, and data lines 110. The photo TFT 102 has source and drain electrodes disposed in an interdigitated pattern. Since the reference TFT 114 has similar dimensions to the photo TFT 102, the reference TFT 114 is likewise configured in an interdigitated pattern. To prevent an increase in the footprint of the sensor element 100, the photo TFT 102 and the reference TFT 114 may be smaller than the photo TFT 12 of the previous embodiments. As such, the photo TFT 102 and the reference TFT 114 includes fewer extending members of the source and drain electrodes.

Figure 10:
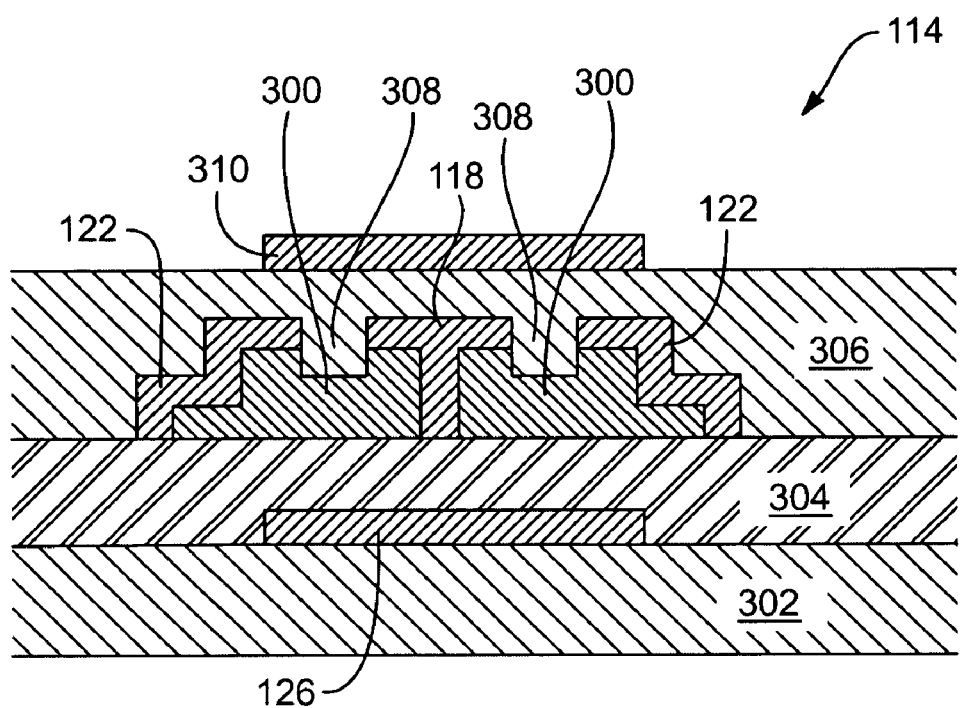
FIG. 10 is a cross-sectional view of an embodiment of a compensation TFT.

Referring to FIG. 10, a cross-sectional view of one embodiment of a reference TFT 114 is shown. The source and drain electrodes 122, 118 are formed in an interdigitated pattern with a semiconductor material 300 disposed between to form a gate controlled current channel. The semiconductor material 300 may be formed of amorphous silicon or any other common material. Deposition of the electrodes 122, 118 and the semiconductor material 300 may be achieved through methods commonly known in the art.

The reference TFT 114 further includes a substrate 302, an insulator layer 304 disposed over a gate electrode 126, and a passivation layer 306 to cover and protect channels 308. The reference TFT 114 further includes an opaque light shield 310 to cover and shield the channels 308 from light. The light shield 310 prevents the reference TFT 114 from generating a photocurrent in response to light. A suitable material for the shield layer 310 is Cr.

A photo TFT 102 used in the same sensor element 100 would be similarly embodied but without the light shield 310. One of skill in the art will appreciate that the structure of the reference TFT 114 may vary to reflect the structure of the photo TFT 102. The embodiment shown in FIG. 9 is for illustrative purposes only and should not be considered limiting of the present invention.

Figure 11:
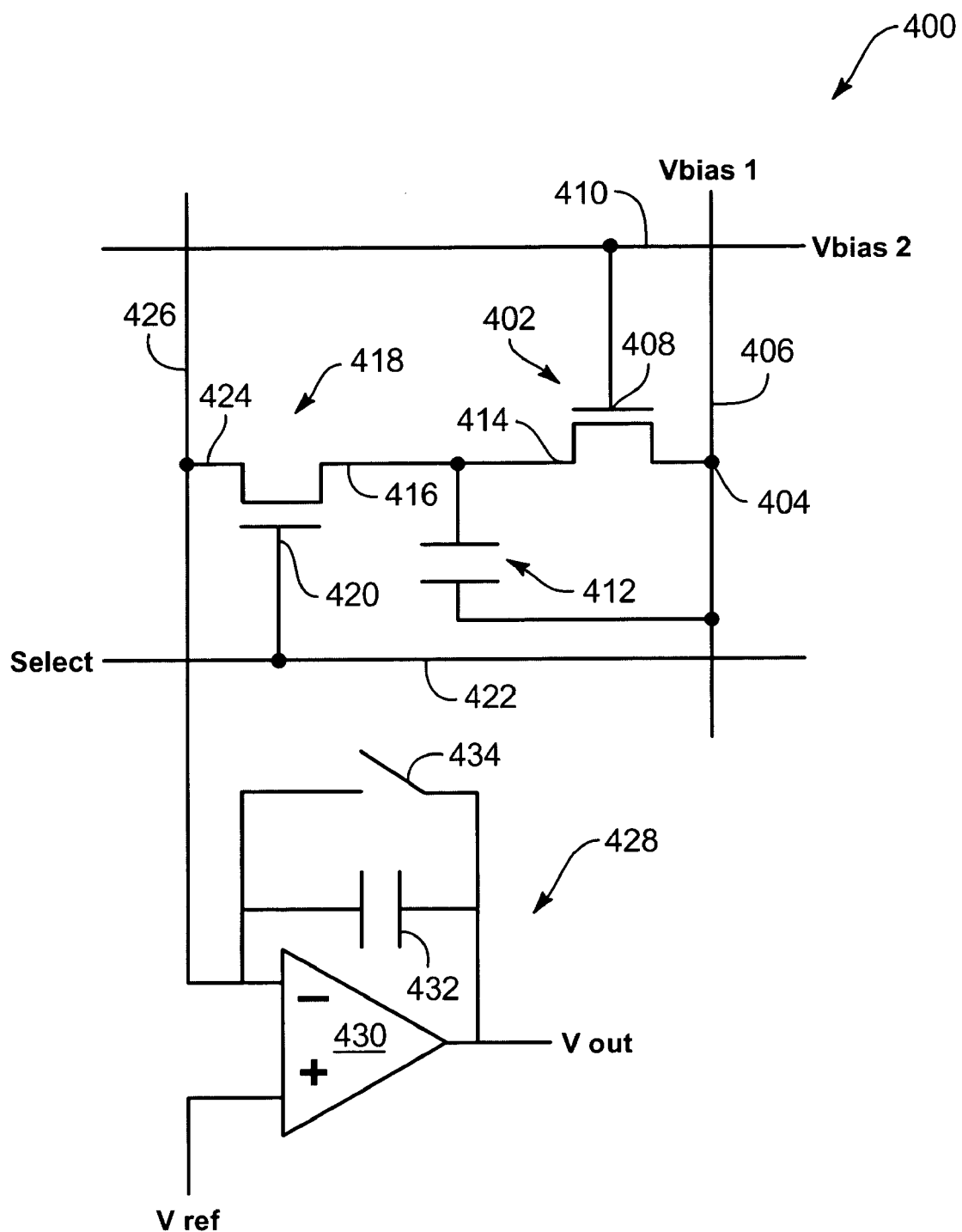
FIG. 11 is a schematic diagram of an alternative embodiment of a sensor element.

Referring to FIG. 11, a schematic of an alternative sensor element 400 is shown for use in an image sensor matrix array. A pixel includes one or more sensor elements 400. The sensor element 400 includes a photo TFT 402 that generates a photocurrent in response to received light. The photo TFT 402 includes thin film layers and is similar to photo TFTs previously described above. As such, the photo TFT 402 is a gated device having similarly doped contact regions and an intrinsic semiconductor region disposed between.

The photo TFT 402 has a source electrode 404 that is coupled to a first voltage bias line 406 and a gate electrode 408 that is coupled to a second voltage bias line 410. The first and second voltage bias lines 406, 410 serve multiple photosensitive elements in an array. The source electrode 404 and gate electrode 408 are controlled independently by the separate first and second biases 406, 410. This embodiment provides a lower dark current which improves the dynamic range and signal-to-noise ratio of the array in imaging applications.

The sensor element 400 includes a storage capacitor 412 that is disposed in parallel to the photo TFT 402 such that the storage capacitor 412 is coupled to the source electrode 404 and to a drain electrode 414 of the photo TFT 402. The storage capacitor 412 is discharged when the photo TFT 402 is exposed to light.

The storage capacitor 412 and the drain electrode 414 are coupled to the source electrode 416 of a readout TFT 418. A gate electrode 420 of the readout TFT 418 is coupled to a select line 422 to enable the readout TFT 418. A drain electrode 424 of the readout TFT 418 is coupled to a data line 426 to allow periodic readouts of a charge on the storage capacitor 412. The photo TFT 402 and the readout TFT 418 may include amorphous silicon, are similar to TFTs previously described, and are manufactured using any number of TFT processing techniques.

In one embodiment, the data line 426 is coupled to an amplification circuit 428 to amplify the signal from the sensor element 400. The amplification circuit 428 includes an operational amplifier 430 having the data line 426 as a negative input and a $V_{ref}$ as a positive input. The operational amplifier 430 is in parallel with a capacitor 432 and a switch 434 to enable operation.

Figure 12:
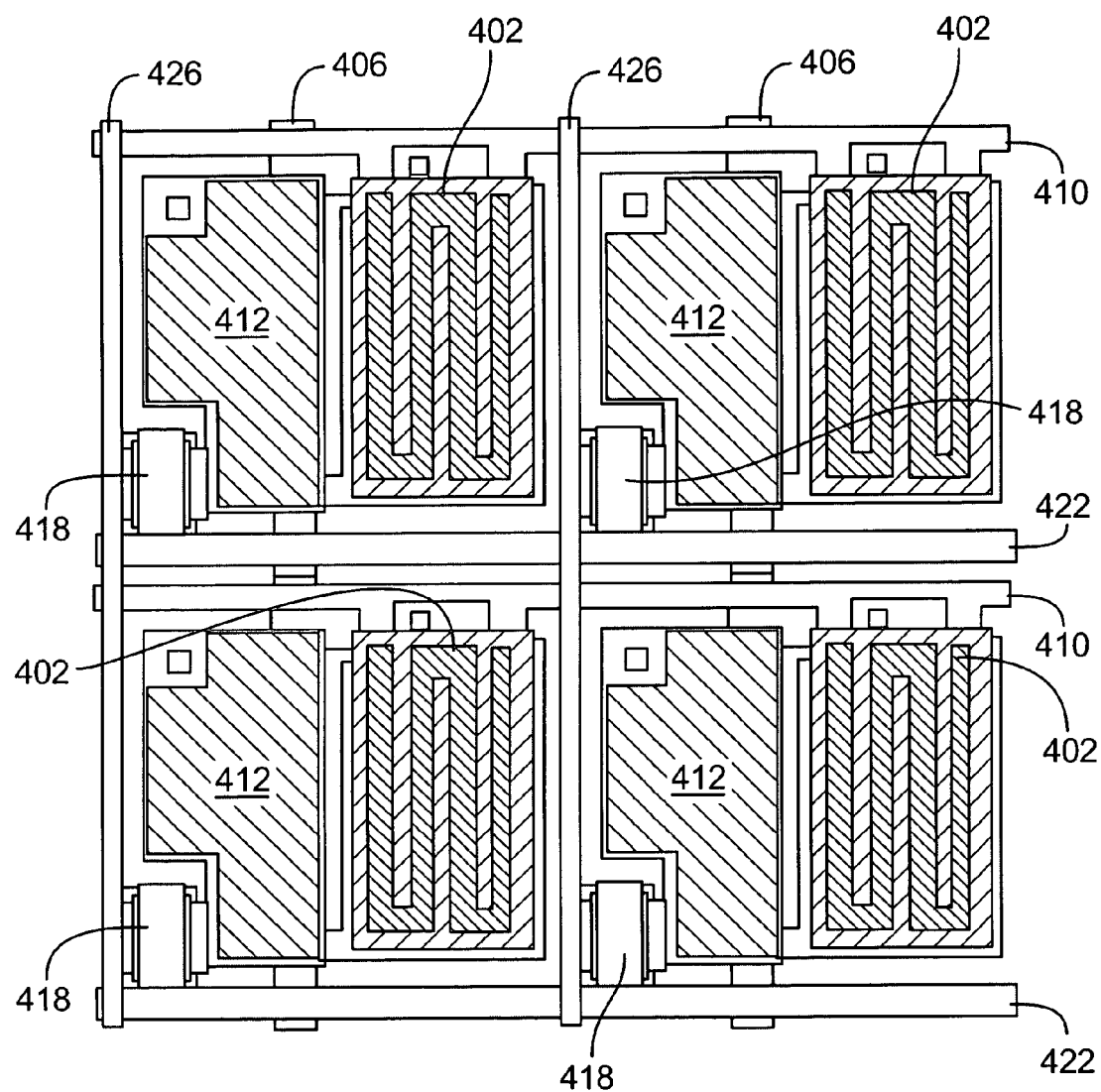
FIG. 12 is a plan view of sensor elements of FIG. 11 for use in an image sensor array.

Referring to FIG. 12, a plan view of four sensor elements 400 as they would be disposed in an array is shown. The plan view provides a view of components relative to one another and illustrates the use of shared use of first and second voltage bias lines 406, 410, select lines 422, and data lines 426. As in previous embodiments, the source electrode 404 and drain electrode 414 include extending members that are interdigitated with one another to improve the photosensitivity of the photo TFT 402. Alternative designs such as a simple inverted staggered structure, trilayer type inverted staggered structure, or other known structures are also possible and are within the scope of the invention.

The photo TFTs 402 and the storage capacitors 412 occupy most of the surface area of a sensor element 400. The relatively large size of the photo TFT 402 improves collection of visible photons generated by the x-rays. In some implementations, the photo TFT 402 and the storage capacitor 412 encompass 70 to 90 percent of the surface area of the sensor element 400. Furthermore, increasing the density of the sensor elements 400, and their corresponding photo TFTs 402, over a surface area improves the collection of visible photons. As the present invention is intended for direct light collection, there is no need to collect reflected light originating from below a sensor element. Accordingly, the sensor elements 400 may be opaque and disposed with very little space between adjacent sensor elements 400.

Figure 13:
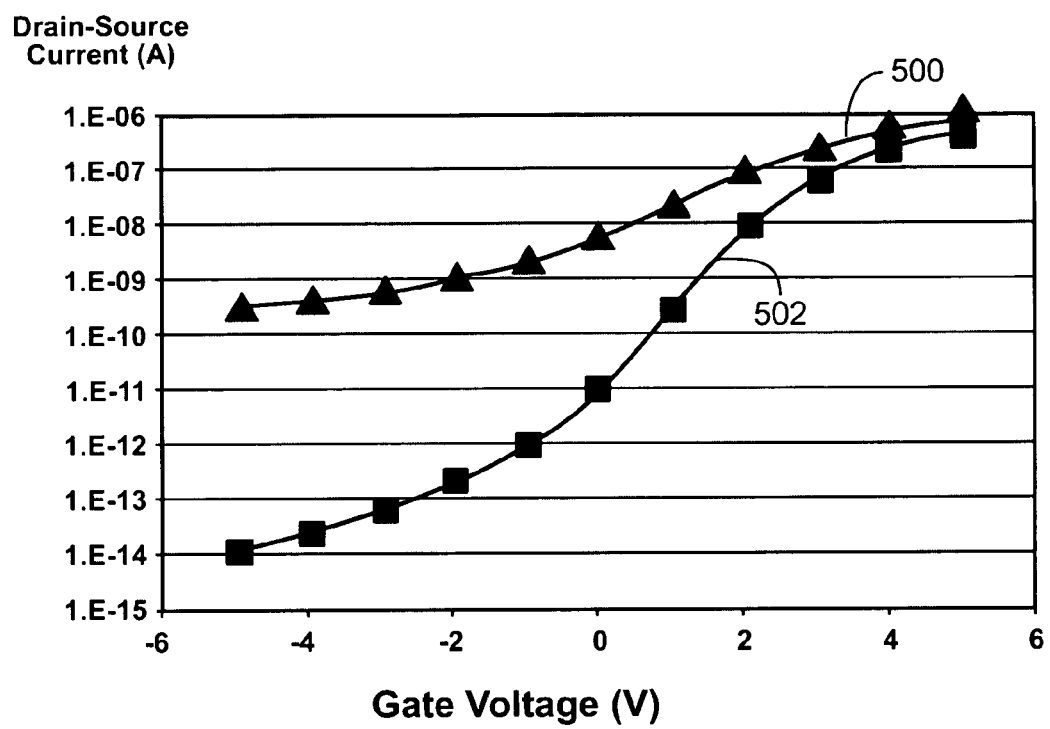
FIG. 13 is a graph illustrating photocurrent and dark current in a photo TFT as a result of an applied gate voltage.

Referring to FIG. 13 a graph illustrating examples of generated dark-current photocurrent 500 and dark current 502 versus gate voltage in a sensor element 400 is shown. By independently biasing the gate voltage, the band bending at the gate interface can be varied. This allows the dark current to be modified over several orders of magnitude. The generated photocurrent also varies with the second voltage bias as a result of a change in the lifetime of photo-generated electrons by the band bending. The dependence of the photocurrent on gate voltage is not as strong as that of the dark current.

Depending on the application, the gate voltage can be adjusted to obtain the optimum range of dark current and photocurrent. In x-ray imaging, the illumination time and data readout time per exposure depends on the application. For radiography and mammography, the exposure time is a few hundred milliseconds and the readout time is less than 5 seconds. For X-ray fluoroscopy, the exposure is typically continuous and readout occurs at a 30 Hz rate.

Figure 14:
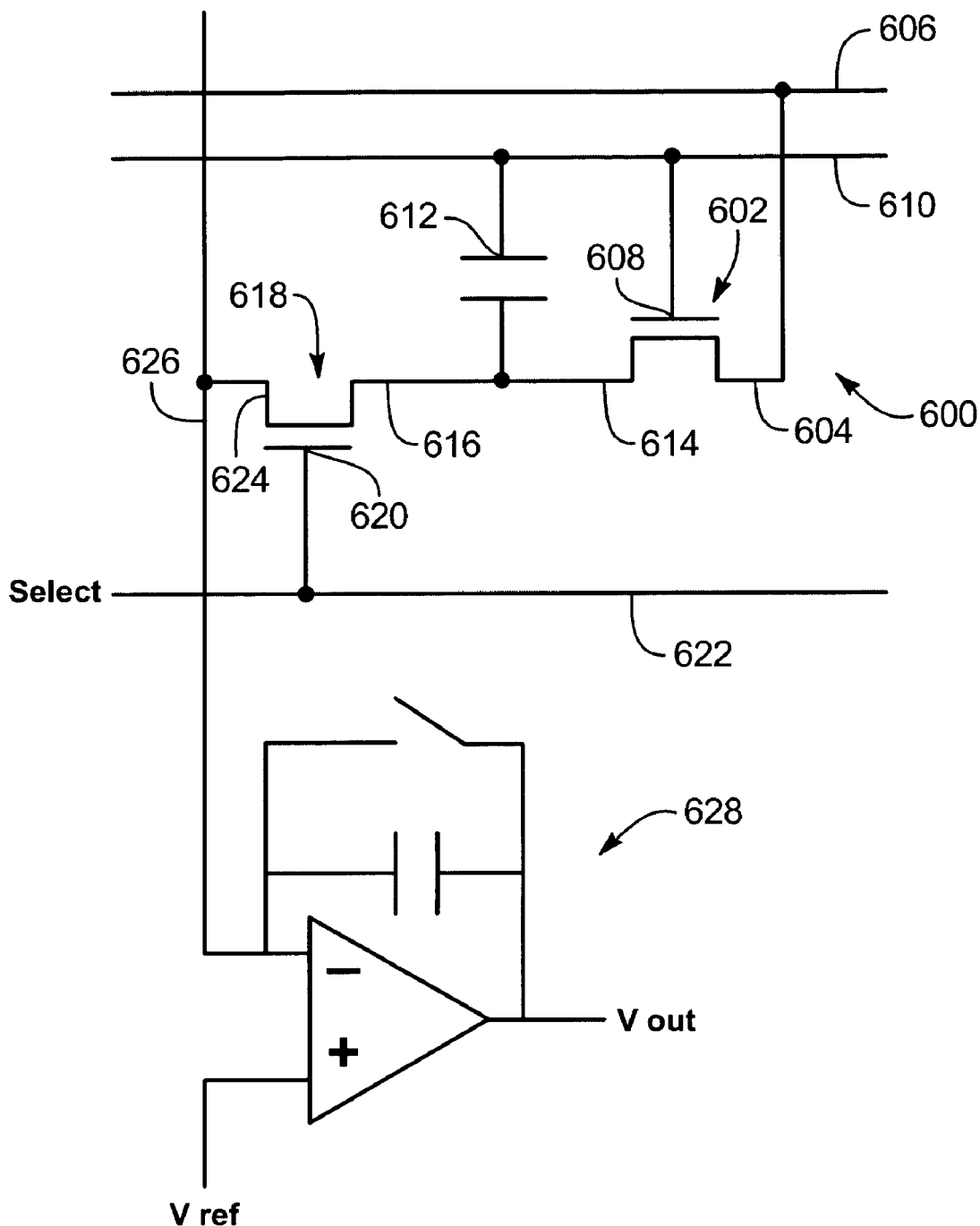
FIG. 14 is a schematic diagram of an alternative embodiment of a sensor element.

Referring to FIG. 14, an alternative embodiment of a sensor element 600 is shown. A photo TFT 602 is coupled, at its source electrode 604, to an adjacent select line 606 that is used to enable operation of a readout TFT of an adjacent sensor element. The gate electrode 608 is coupled to a voltage bias line 610. A storage capacitor 612 is coupled to the voltage bias line 610 and to a drain electrode 614 of the photo TFT 602. The drain electrode 614 and the storage capacitor 612 are both coupled to a source electrode 616 of a readout TFT 618. A gate electrode 620 of the readout TFT 618 is coupled to a select line 622 to enable operation. A drain electrode 624 of the readout TFT 618 is coupled to a data line 626 as in previous embodiments. The data line 626 is coupled to an amplifier circuit 628 similar to that of the embodiment shown in FIG. 11. By coupling the source electrode 604 to an adjacent select line 606, the need for an additional voltage bias line is eliminated while maintaining independent control of the gate voltage for the photo TFT 602.

Figure 15:
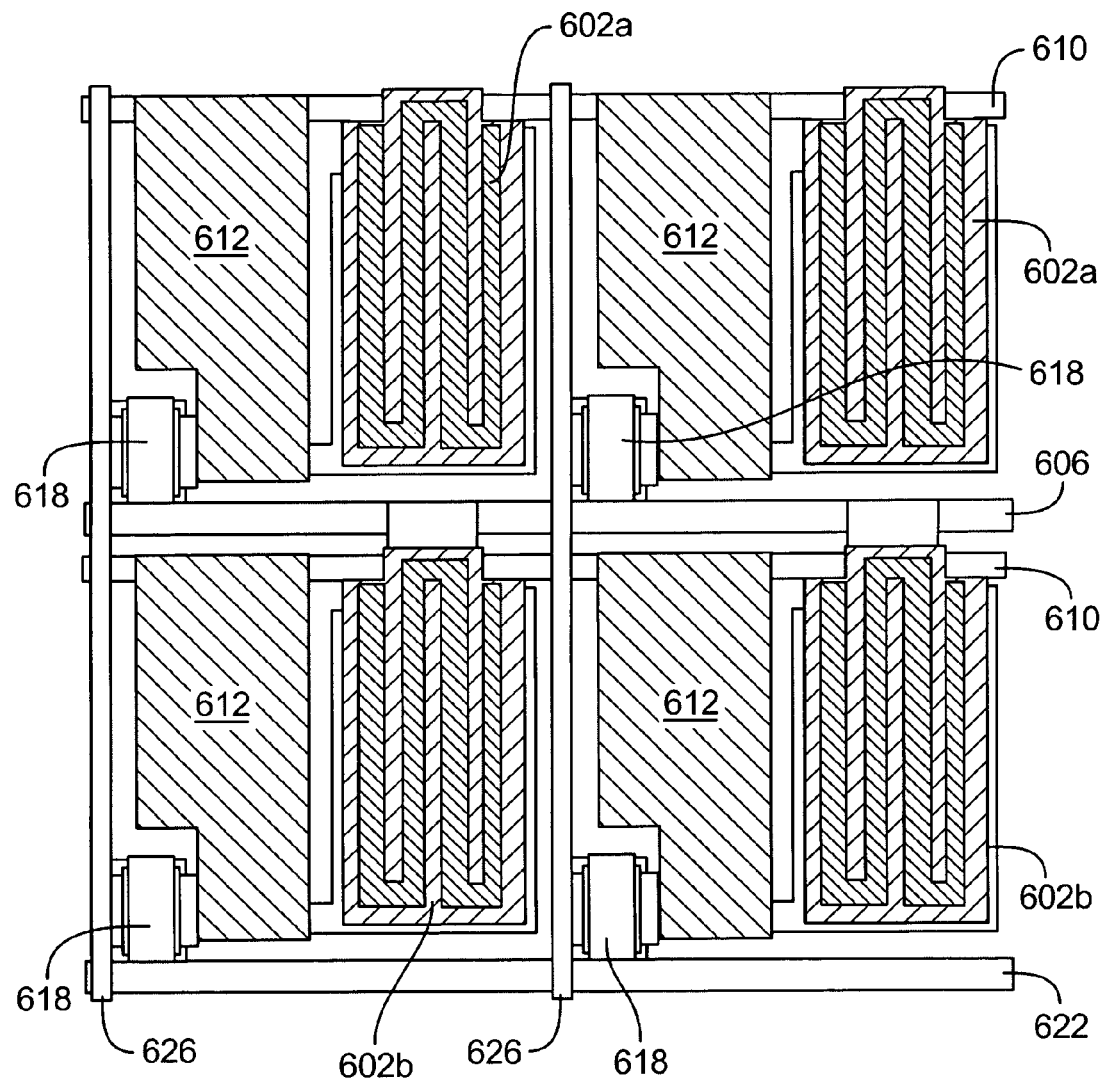
FIG. 15 is a plan view of sensor elements of FIG. 14 for use in an image sensor array.

Referring to FIG. 15, a plan view of four sensor elements 600 arranged in a matrix is shown. Photo TFTs 602b are below photo TFTs 602a and are coupled to select line 606. When the scanning direction is top to bottom, the source electrodes 604 of the photo TFTs 602b are coupled to the select line 606 that is activated just prior to readout. When the scanning direction is bottom to top, the source electrodes 604 of the photo TFT 602b is connected to the select line 606 that is activated immediately after readout. The latter scanning direction is less likely to distort the readout signal.

Figure 16:
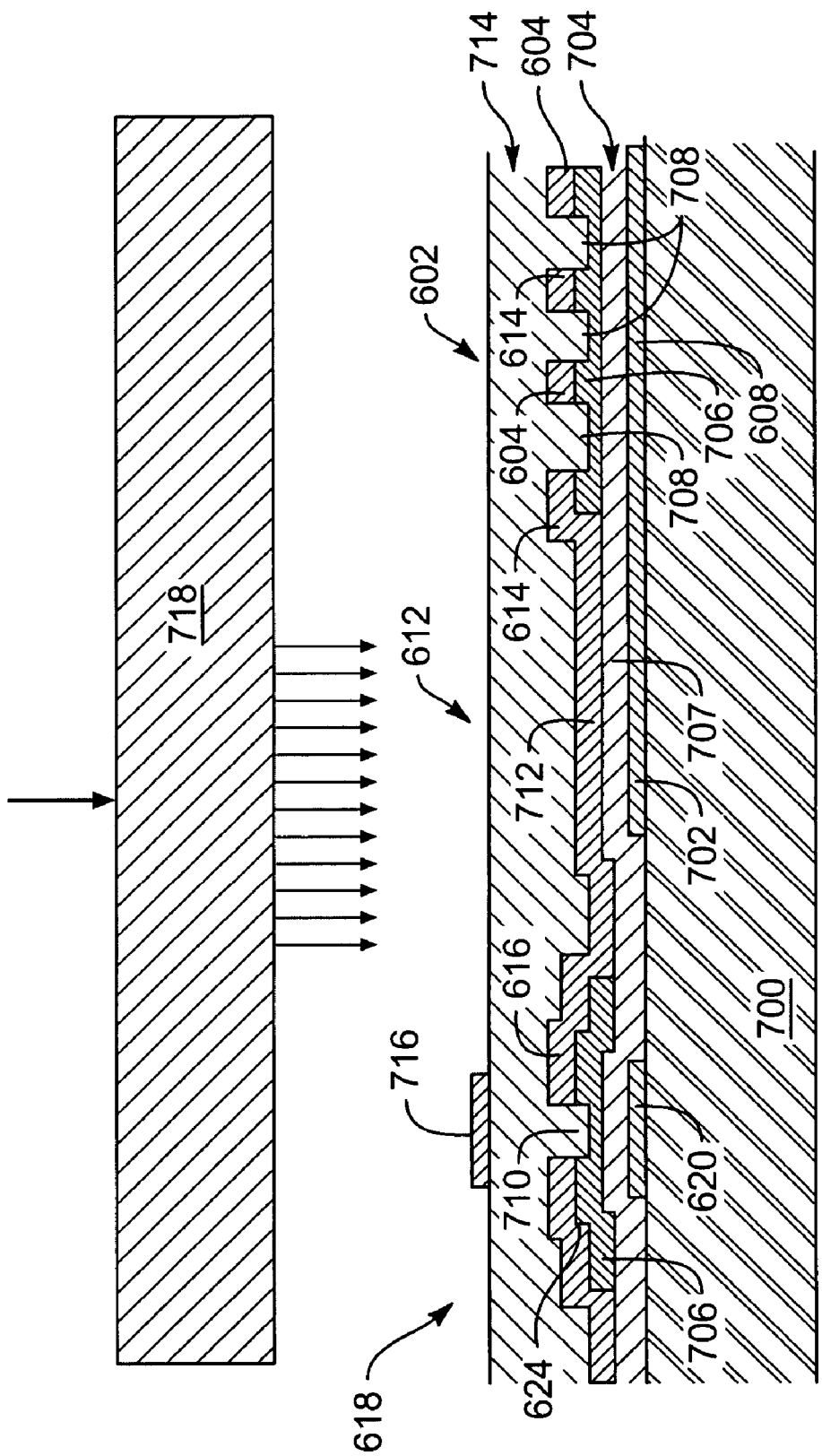
FIG. 16 is a cross-sectional view of a sensor element of FIG. 14.

Referring to FIG. 16, a cross-sectional view of an embodiment of the sensor element 600 of FIG. 14 is shown. Formation of the sensor element 600 may be achieved using a five mask process. A similar process may be used to form the sensor element 400 of FIG. 11. In a first mask, the gate electrodes 608, 620 are deposited and patterned on an insulating transparent substrate 700, such as glass, quartz, sapphire, or the like. The gate electrodes 608, 620 may include metals such as Cr, Cu, Al, Ta, Ti or the like. The gate electrode 608 further extends to form the bottom electrode 702 of the storage capacitor 612.

In a second mask, a gate insulator 704 and a semiconductor layer 706 are deposited and formed. The gate insulator 704 insulates the gate electrodes 608, 620 from the semiconductor layer 706 and may include silicon nitride, silicon oxide, or the like. The gate insulator 704 further serves as a dielectric layer 707 for the storage capacitor 612. The semiconductor layer 706 is deposited on the gate insulator 704 above the gate electrodes 608, 620. The semiconductor layer 706 is deposited for both the photo TFT 602 and the readout TFT 618 and may include a-Si, p-Si, amorphous silicon carbide (SiC), tellurium (Te), selenium (Se), cadmium sulfide (CdS), cadmium selenide (CdSe), or the like. The semiconductor layer 706 also includes an n+ layer that contacts the source and drain electrodes 604, 614, 616, 624. The n+ layer provides a low resistance contact for the source and drain electrodes 604, 614, 616, 624 and suppresses hole injection at negative gate voltage.

In a third mask, the metal source and drain electrodes 604, 614, 616, 624 are deposited and patterned. The source and drain electrodes 604, 614, 616, 624 are deposited and separated by a co-planar region of semiconductor material 706 to form photo TFT and readout TFT current channels 708, 710. With the photo TFT 602, the source and drain electrodes 604, 614 have interdigitated extending members that form multiple channels 708. The drain electrode 614 extends to form a top electrode 712 for the storage capacitor 612. The top electrode 712 also couples to the source electrode 616 of the readout TFT 618. In an alternative embodiment, the storage capacitor 612 may be embodied as a stacked capacitor having one more additional electrodes.

In a fourth mask, a passivation layer 714 is deposited and patterned on the source and drain electrodes 604, 614, 616, 624 and within the channels 708, 710. The passivation layer 714 may include silicon nitride, silicon oxide, polymers and combinations thereof.

In a fifth mask, a light shield 716 is deposited and patterned on the passivation layer 714. As the readout TFT 618 is exposed to light, the light shield 716 prevents a charge from leaking from the storage capacitor 612 through the readout TFT 618. The light shield 716 is opaque and may include Cr or other suitable material. In an alternative embodiment, the light shield 716 may extend and serve as an additional electrode for the storage capacitor 612.

A screen 718 is disposed some distance from the passivation layer 714 to absorb x-rays and convert the energy to light. As previously discussed in prior embodiments, the screen 718 includes a scintillator material that generates light photons for received x-ray photons. The scintillator material may be a relatively low cost external phosphor such as Kodak® LANEX or a CsI coating. Alternative scintillator materials may be used as well and are included within the scope of the invention.

The photo TFT 402, 602 provides a lower fill factor, i.e. the active photosensitive area as a fraction of total pixel area, than convention sensor elements using a-Si PIN photodiodes. Sensor elements 400, 600 in accordance with preferred embodiments typically have fill factors ranging from 15 to 25 percent whereas photodiode sensor elements have fill factors ranging from 50 to 70 percent. Furthermore, the photocurrent per pixel can still be higher with a photo TFT than with a photodiode as a result of photoconductive gain in the photo TFT.

Figure 17:
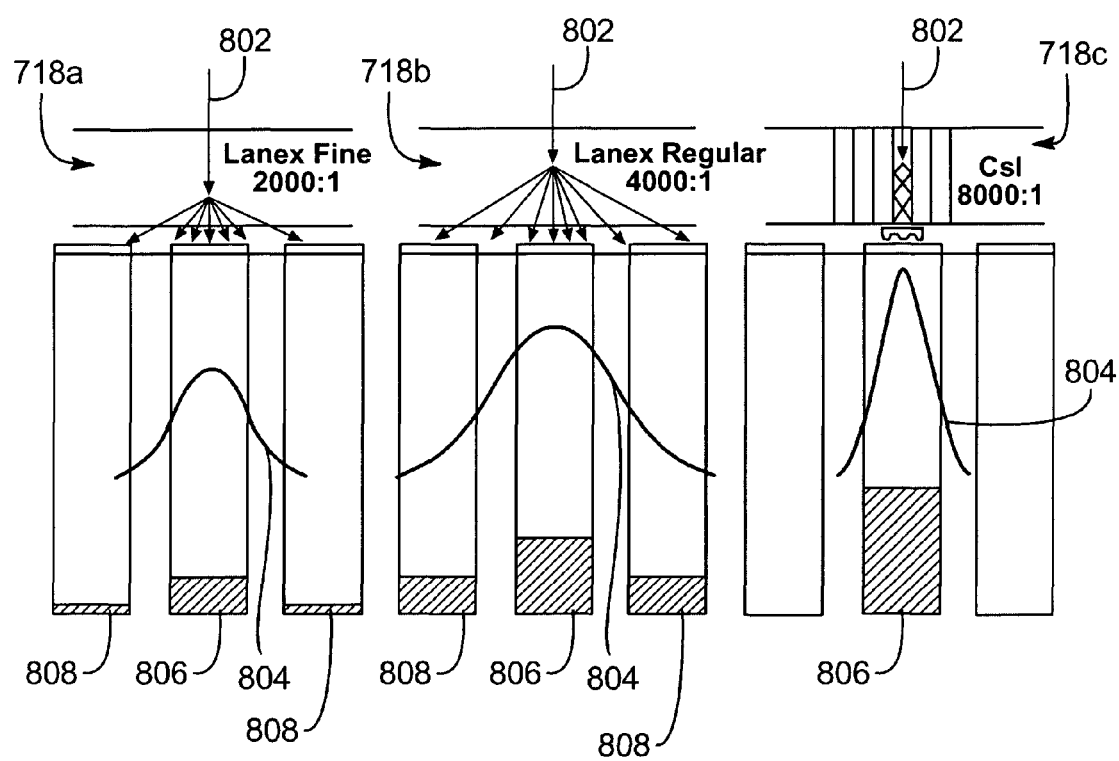
FIG. 17 is a graph illustrating photon distribution and charge capture by a photodiode.

Referring to FIG. 17, a graph illustrating the visible photon creation in different screens 718a-c and subsequent charge capture by a photodiode is shown. Each screen 718a-c receives x-ray emissions 802 and generates light and a resulting photon distribution 804. FIG. 17 illustrates the amount of charge capture 806 and undesirable spillover 808 to adjacent pixels that creates a loss of modulation transfer function (MTF).

Figure 18:
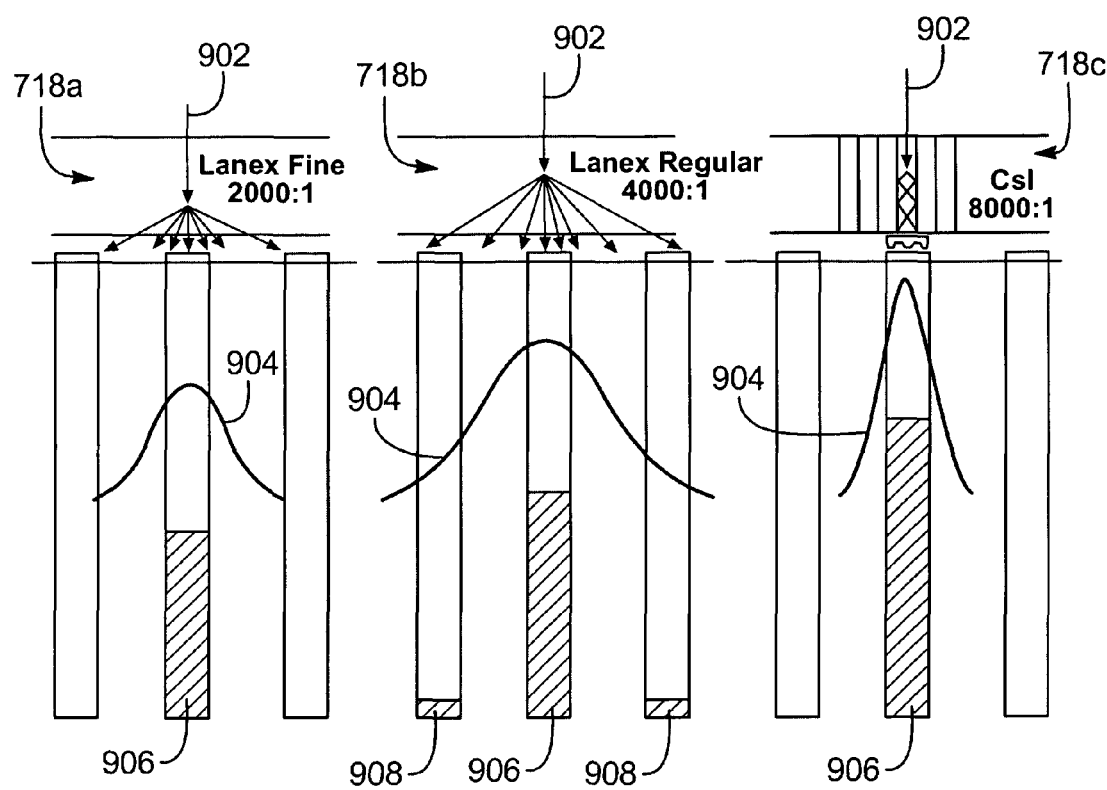
FIG. 18 is a graph illustrating photon distribution and charge capture by a photo TFT.

Referring to FIG. 18, a graph illustrating different screens and subsequent charge capture by a photo TFT is shown. The photo TFT has a lower fill factor and is an improved MTF. As in FIG. 17, the x-ray emissions 902 result in a similar photon distribution 904. However, the charge capture 906 is more focused and spillover 908 is minimized and, in some cases, effectively eliminated. The reduced spillover 908 is because of the increased separation between the photosensitive areas.

This leads to a larger MTF and an enhanced, sharper image. Because of the gain in the photo TFT, it is possible to use low cost fine LANEX screens rather than the more expensive CsI screens to obtain acceptable sensitivity resolution. As a result, the embodiments described herein provide a low cost x-ray image sensor that can be used in conjunction with popular digital imaging products.

Figure 19:
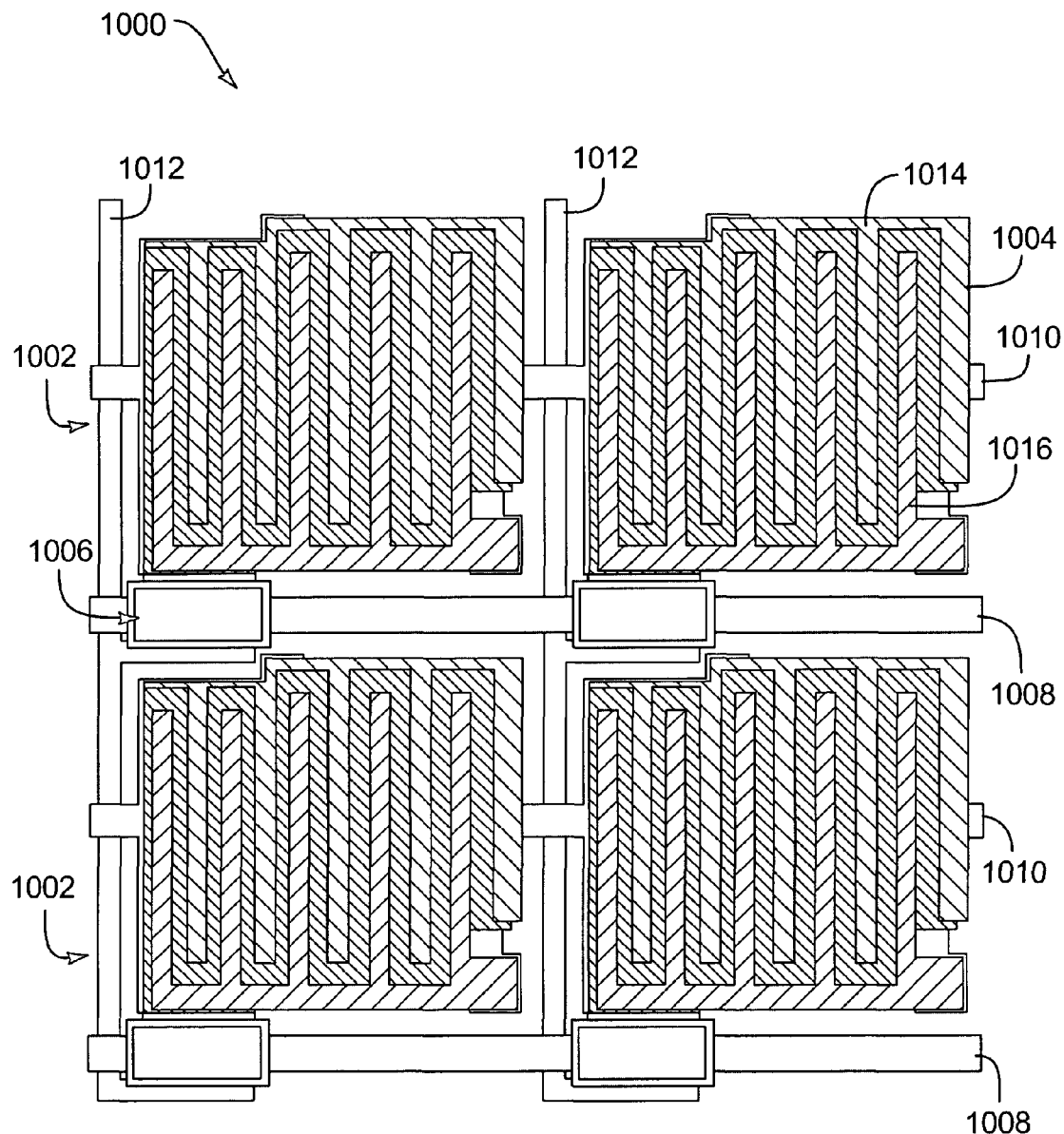
FIG. 19 is a plan view of an embodiment of sensor elements for use in an image sensor array.

Referring to FIG. 19, a plan view of an array 1000 of sensor elements 1002 is shown. Each sensor element 1002 may be schematically configured as illustrated in FIGS. 1A and 1B. Thus, each sensor element 1002 includes a photo TFT 1004, a readout TFT 1006 coupled to the photo TFT 1004, a select line 1008 coupled to the readout TFT 1006, a bias line 1010 coupled to the photo TFT 1004 and a storage capacitor (not shown), and a data line 1012 coupled to the readout TFT 1006. As in previous embodiments, the photo TFT 1004 includes source and drain electrodes 1014, 1016 that may be arranged in an interdigitated pattern.

The photo TFT 1004 is disposed on top of the storage capacitor in a stacked configuration which allows the photo TFT 1004 to extend over more surface area. Thus embodied, the storage capacitor is between a substrate and the photo TFT 1004. This increases the density of the photo TFT 1004 within an array 1000 and substantially increases the light sensitivity of the photo TFT 1004. This is particularly advantageous in detecting the relatively weak light resulting from x-ray emissions. Furthermore, the storage capacitor extends horizontally underneath the photo TFT 1004 to increase the capacitor electrode surfaces and improve capacitive performance.

Figure 20:
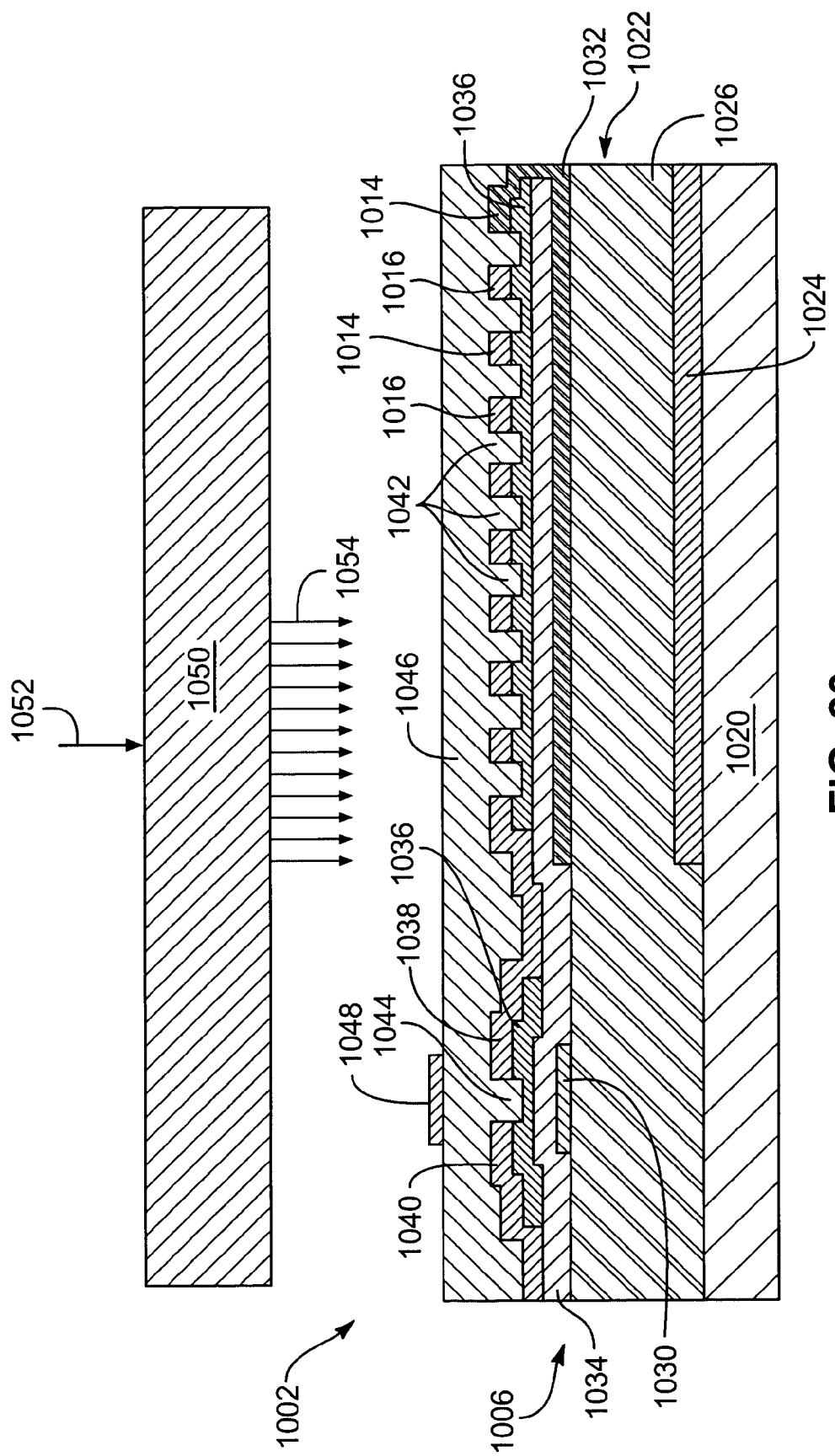
FIG. 20 is a cross-sectional view of a sensor element of FIG. 19.

Referring to FIG. 20, a cross-sectional view of an embodiment of a sensor element 1002 of FIG. 19 is shown. The sensor element 1002 may be manufactured using common TFT masking methods, such as in AMLCD applications. A manufacturing method may be similar to that described in relation to FIG. 16 with the addition of one or two mask steps.

The sensor element 1002 includes an insulating substrate 1020 and a storage capacitor 1022 on the substrate 1020. In a first mask, a bottom electrode 1024 of the storage capacitor 1022 is formed. A dielectric layer 1026 is formed on the bottom electrode 1024 and substrate 1020 and serves as a storage capacitor dielectric layer. In a subsequent mask, a gate electrode 1030 and a top electrode/gate electrode 1032 are deposited on the dielectric layer 1026. The top electrode/gate electrode 1032 serves as components for both the storage capacitor 1022 and the photo TFT 1004. The storage capacitor 1022 may be alternatively embodied as a stacked capacitor with one or more additional electrodes. The storage capacitor 1022 may be coupled to the photo TFT 1004 and the readout TFT 1006 in accordance with the schematic illustrations of FIGS. 1A and 1B.

In the following mask, a gate insulator 1034 and a semiconductor layer 1036 are deposited and formed. The semiconductor layer 1036 is deposited for both the photo TFT 1004 and the readout TFT 1006 and may include materials previously described above. In the next mask, metal source and drain electrodes 1014, 1016 for the photo TFT 1004 and source and drain electrodes for the 1038, 1040 for the readout TFT 1006 are deposited and patterned. The source and drain electrodes 1014, 1016, 1038, 1040 are deposited and separated by the co-planar region of semiconductor material 1036 to form photo TFT and readout TFT current channels 1042, 1044.

The formed source and drain electrodes 1014, 1016 include interdigitated extending members. With the increased surface area of the photo TFT 1004, the number of extending members may also be increased. The next mask includes depositing and patterning a passivation layer 1046 on the source and drain electrodes 1014, 1016, 1038, 1040 and within the channels 1042, 1044.

In a final mask, a light shield 1048 is deposited and patterned on the passivation layer 1046. The light shield 1048 prevents a charge from leaking through the readout TFT 1006. As in previous embodiments, a screen 1050, including a scintillator material, is disposed above the photo TFT 1004 to convert received energy 1052 to light 154.

Figure 21:
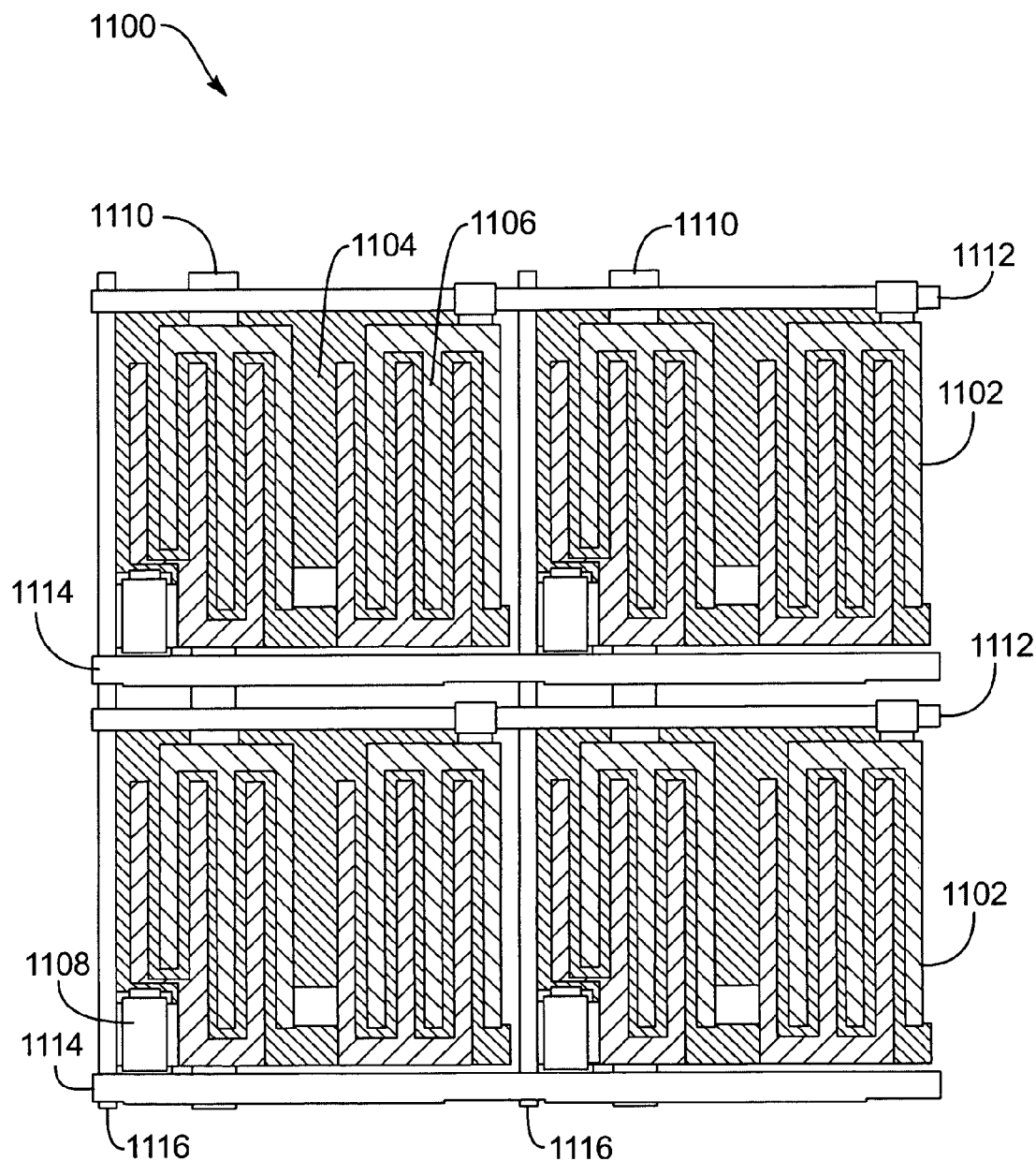
FIG. 21 is a plan view of an embodiment of sensor elements for use in an image sensor array.

Referring to FIG. 21 a plan view of an alternative array 1100 of four sensor elements 1102 is shown. The sensor elements 1102 are each configured as schematically illustrated in FIG. 7. Accordingly, each sensor element 1102 includes a photo TFT 1104, a dark current reference TFT 1106, a storage capacitor (not shown), and a readout TFT 1108. The sensor elements 1102 have their respective photo TFTs 1104 coupled to first bias lines 1110, their reference TFTs 1106 coupled to second bias lines 1112, and the readout TFTs 1108 coupled to select and data lines 1114, 1116.

The dark current reference TFT 1106 serves to cancel dark current resulting from the photo TFT 1104 and has substantially identical dimensions as the photo TFT 1104. The storage capacitor is disposed below the photo TFT 1104 and the dark current reference TFT 1106. Thus, the surface area of the photo TFT 1104 and the dark current reference TFT 1106 is significantly increased as is the light detection sensitivity of the photo TFT 1104. The storage capacitor also has improved capacitance and it may extend substantially the same horizontal area of both the photo TFT 1104 and the dark current reference TFT 1106.

Figure 22:
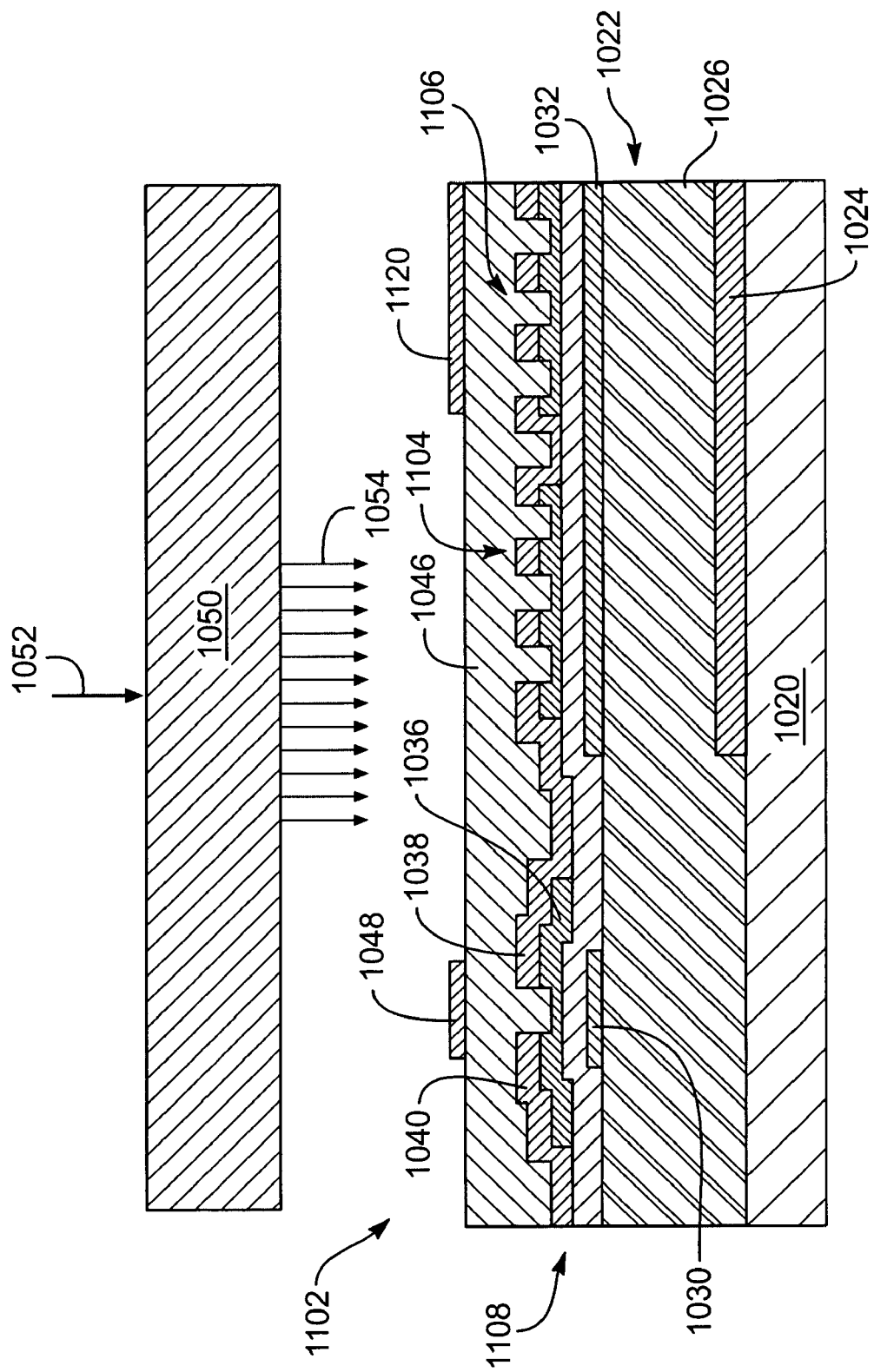
FIG. 22 is a cross-sectional view of a sensor element of FIG. 21.

Referring to FIG. 22, a cross-sectional view of a sensor element 1102 of FIG. 21 is shown. The sensor element 1102 may be manufactured in a similar manner to that described in reference to FIG. 20. A storage capacitor 1022 is shown disposed beneath the photo TFT 1104 and the dark current reference TFT 1106.

The sensor element 1102 differs from the sensor element 1002 in that a dark current reference TFT 1106 is provided. The dark current reference TFT 1106 requires approximately the same surface area as that of the photo TFT 1104. The dark current reference TFT 1106 couples to the photo TFT 1104 as required by the schematic illustration of FIG. 7. The sensor element 1102 further differs from the previous embodiment in that an opaque light shield 1120 is disposed over the dark current reference TFT 1106. In this manner, the dark current reference TFT 1106 only generates dark current to compensate for the dark current of the photo TFT 1104. All other elements of the sensor element 1102 are common to that of FIG. 21.

Figure 23:
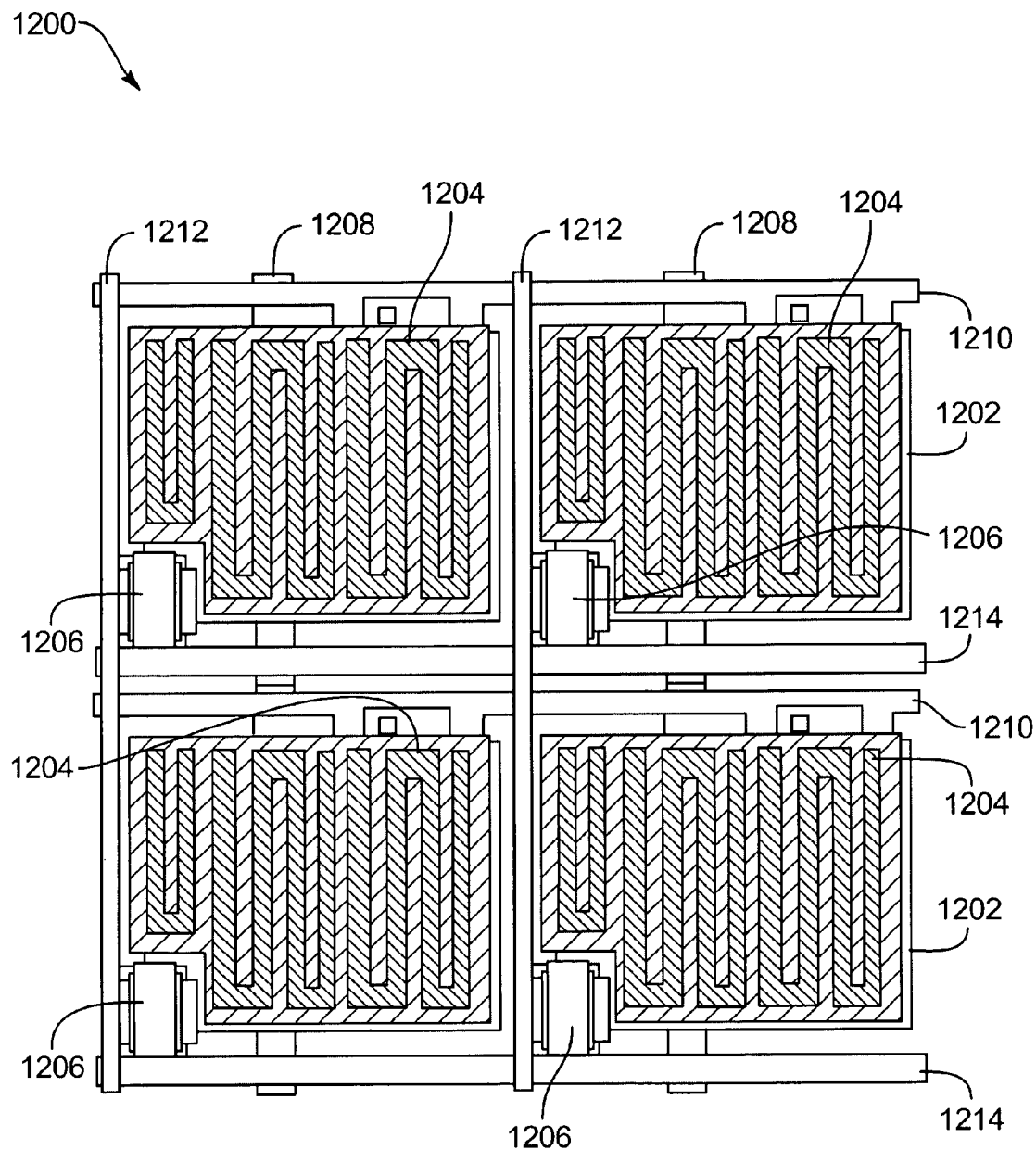
FIG. 23 is a plan view of an embodiment of sensor elements for use in an image sensor array.

Referring to FIG. 23, a plan view of an alternative array 1200 of sensor elements 1202 is shown. Each sensor element 1202 is configured as schematically illustrated in FIG. 11. Accordingly, each sensor element 1202 includes a photo TFT 1204, a readout TFT 1206, and a storage capacitor (not shown). The photo TFT 1204 is coupled to first and second bias lines 1208, 1210. Each readout TFT 1206 is coupled to corresponding data lines 1212 and select lines 1214. As in the embodiments of FIGS. 19-22, the storage capacitor is disposed vertically below the photo TFT 1204 in a stacked configuration. A cross-sectional view of the sensor element 1202 is similar to that shown in FIG. 20.

Figure 24:
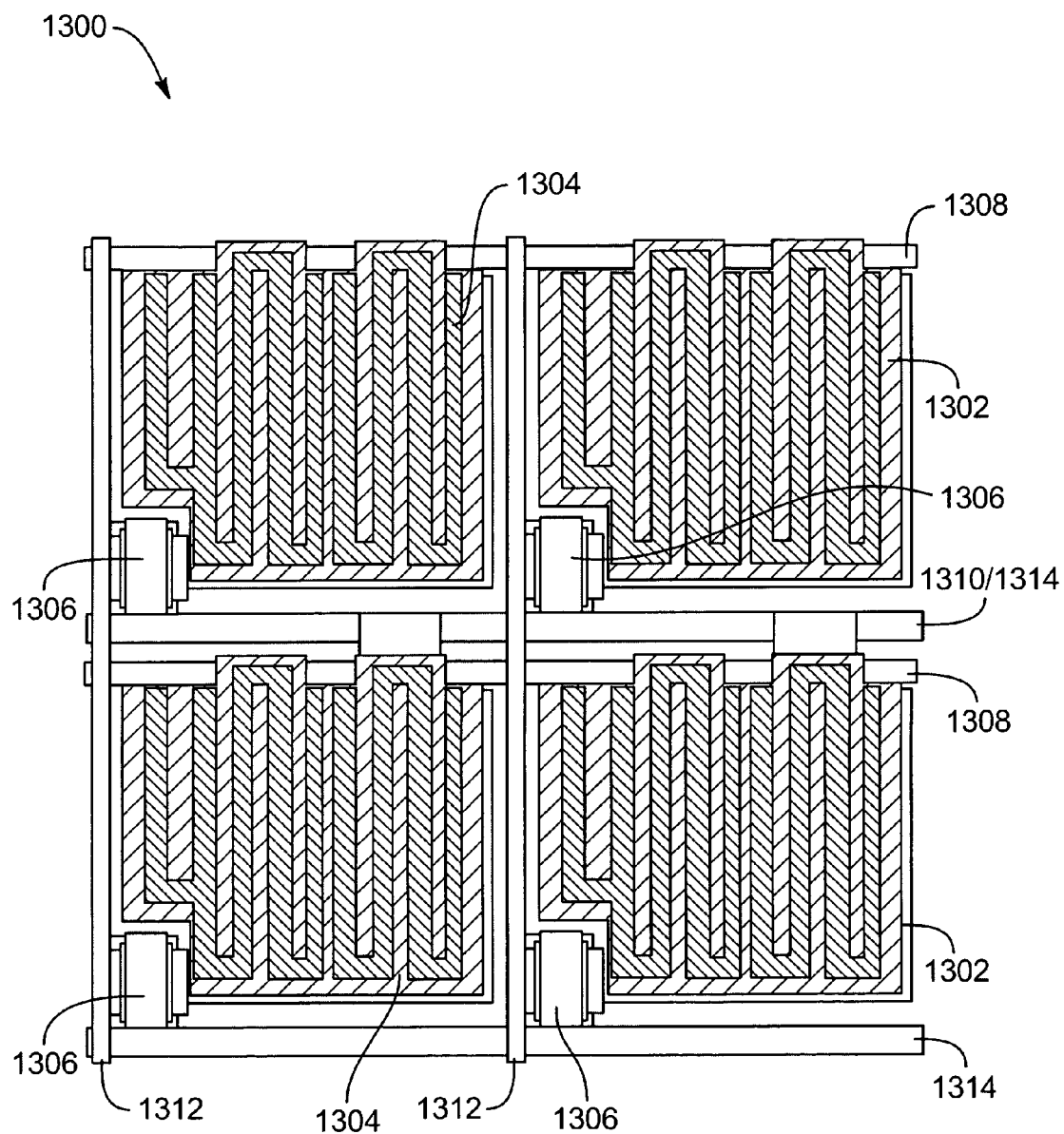
FIG. 24 is a plan view of an embodiment of sensor elements for use in an image sensor array.

Referring to FIG. 24, a plan view of an alternative array 1300 of sensor elements 1302 is shown. Each sensor element 1302 is configured as schematically illustrated in FIG. 14 and includes a photo TFT 1304, a readout TFT 1306, and a storage capacitor (not shown). The photo TFT 1204 is coupled to a bias line 1308 and to a select line 1310 of an adjacent sensor element 1302. Each readout TFT 1206 is coupled to corresponding data lines 1312 and select lines 1314. As in the embodiments of FIGS. 19-23, the storage capacitor is disposed vertically below the photo TFT 1304 in a stacked configuration. A cross-sectional view of the sensor element 1302 is similar to that shown in FIG. 20.

As discussed and illustrated in reference to FIGS. 19-24, the sensor elements of the present invention may include a storage capacitor disposed between the substrate and a photo TFT to provide a vertically stacked configuration. With increased capacitance, the resulting readout charge delivered through the data line to an amplifier circuit is greater. The amplifier circuit is designed to account for this increase. The stacked photo TFT and storage capacitor provides enhanced light detection and capacitance while requiring additional, and perhaps customized, mask steps. Given the improved performance, the additional manufacturing may be justified in certain applications.

It will be obvious to those having skill in the art that many changes may be made to the details of the above-described embodiments without departing from the underlying principles thereof. The scope of the present invention should, therefore, be determined only by the following claims.

The invention claimed is:

1. An image sensor for sensing a received image, comprising:
   a substrate;
   a photo TFT disposed on the substrate to generate a photocurrent responsive to the received image, the photo TFT including,
   a source electrode directly coupled to a select line corresponding to an adjacent image sensor,
   a gate electrode directly coupled to a bias line,
   a drain electrode, and
   a semiconductor layer directly coupled to the source and drain electrodes; and
   a storage capacitor disposed on the substrate and directly coupled to the gate electrode and drain electrode of the photo TFT, the storage capacitor storing a charge generated by the photocurrent.

2. The image sensor of claim 1 wherein the source electrode and the drain electrode of the photo TFT each include a plurality of extending members, the extending members of the source electrode interdigitated with the extending members of the drain electrode.

3. The image sensor of claim 1, further comprising:
   a readout TFT disposed on the substrate and including, a gate electrode directly coupled to a second select line, a source electrode directly coupled to the drain electrode of the photo TFT, a drain electrode directly coupled to a data line, and a semiconductor layer directly coupled to the source and drain electrodes.

4. The image sensor of claim 3 further comprising:
   a passivation layer disposed on the photo TFT and the readout TFT; and
   a light shield disposed on the passivation layer substantially above the readout TFT.

5. The image sensor of claim 1 wherein the storage capacitor comprises a stacked capacitor.

6. The image sensor of claim 1 wherein the semiconductor layer includes a n+ layer in contact with the source and drain electrodes.

7. The image sensor of claim 1 wherein the semiconductor layer of the photo TFT includes amorphous silicon.

8. The image sensor of claim 1 wherein the photo TFT includes a gate insulator disposed between the respective gate electrode and semiconductor layer and preventing contact between the gate electrode and the semiconductor layer.

9. The image sensor of claim 1 wherein the gate electrode is selected from a group consisting of Cu, Cr, Al, Ta, and Ti.

10. The image sensor of claim 1 further comprising a passivation layer disposed on the photo TFT.

11. The image sensor of claim 10 wherein the passivation layer is selected from the group consisting of silicon nitride, silicon oxide, and tantalum oxide.

12. The image sensor of claim 1 further comprising a screen disposed adjacent the photo TFT to convert received x-rays to visible light.

13. An image sensor array for sensing a received image, comprising:
   a substrate;
   a plurality of bias lines disposed on the substrate;
   a plurality of data lines disposed on the substrate;
   a plurality of select lines disposed on the substrate;
   a plurality of photo TFTs disposed on the substrate to generate a photocurrent responsive to the received image, each photo TFT including,
   a source electrode directly coupled to a select line corresponding to an adjacent readout TFT,
   a gate electrode directly coupled to a corresponding bias line,
   a drain electrode, and
   a semiconductor layer directly coupled to the source and drain electrodes;
   a plurality of storage capacitors disposed on the substrate, each storage capacitor directly coupled to the corresponding bias line and to the drain electrode of a corresponding photo TFT, each storage capacitor storing a charge generated by a photocurrent; and
   a plurality of readout TFTs disposed on the substrate, each readout TFT including,
   a gate electrode directly coupled to a corresponding select line,
   a source electrode directly coupled to the drain electrode of a corresponding photo TFT and directly coupled to the storage capacitor,
   a drain electrode directly coupled to a corresponding data line, and
   a semiconductor layer directly coupled to the source and drain electrodes, wherein each readout TFT passes a current to a corresponding data line in response to the discharge of a corresponding storage capacitor.

14. The image sensor array of claim 13 wherein the source electrode and the drain electrode of the photo TFTs each include a plurality of extending members, the extending members of the source electrode interdigitated with the extending members of the drain electrode.

15. The image sensor array of claim 13 wherein the semiconductor layers of each photo TFT and readout TFT include amorphous silicon.

16. The image sensor array of claim 13 wherein the storage capacitors include a stacked capacitor.

17. The image sensor array of claim 13 wherein each photo TFT and readout TFT includes a gate insulator disposed between the respective gate electrode and semiconductor layer and preventing contact between the gate electrode and the semiconductor layer.

18. The image sensor array of claim 13 further comprising a passivation layer disposed on each photo TFT and readout TFT.

19. The image sensor array of claim 18 further comprising a plurality of light shields disposed on the passivation layer substantially above a corresponding readout TFT.

20. The image sensor array of claim 13 further comprising a screen disposed adjacent to the photo TFTs to convert received x-rays to visible light.

21. An image sensor for sensing a received image, comprising:
   a substrate;
   a photo TFT to generate a photocurrent responsive to the received image, the photo TFT including,
      a source electrode directly coupled to a select line corresponding to an adjacent image sensor,
      a gate electrode directly coupled to a bias line,
      a drain electrode, and
      a semiconductor layer directly coupled to the source and drain electrodes; and
   a storage capacitor disposed between the substrate and the photo TFT and directly coupled to the gate electrode and drain electrode of the photo TFT, the storage capacitor storing a charge generated by the photocurrent.

22. The image sensor of claim 21 wherein the storage capacitor includes top and bottom electrodes and wherein the gate electrode of the photo TFT is the top electrode of the storage capacitor.

23. The image sensor of claim 21 wherein the source electrode and the drain electrode of the photo TFT each include a plurality of extending members, the extending members of the source electrode interdigitated with the extending members of the drain electrode.

24. The image sensor of claim 21, further comprising:
   a readout TFT disposed on the substrate and including,
      a gate electrode directly coupled to a second select line,
      a source electrode directly coupled to the drain electrode of the photo TFT,
      a drain electrode directly coupled to a data line, and
      a semiconductor layer directly coupled to the source and drain electrodes.

25. The image sensor of claim 21 wherein the storage capacitor comprises a stacked capacitor.

* * * * *

UNITED STATES PATENT AND TRADEMARK OFFICE
CERTIFICATE OF CORRECTION

PATENT NO.            : 7,773,139 B2                                       Page 1 of 1
APPLICATION NO.       : 10/825922
DATED                 : August 10, 2010
INVENTOR(S)           : Willem den Boer et al.

It is certified that error appears in the above-identified patent and that said Letters Patent is hereby corrected as shown below:

Title Pg, Item (54), and in Col. 1, Line 1-2, delete "IMAGE SENSOR WITH PHOTOSENSITIVE THIN FILM TRANSISTORS" and insert -- IMAGE SENSOR WITH PHOTOSENSITIVE THIN FILM TRANSISTORS AND DARK CURRENT COMPENSATION --, therefor.

In column 4, line 7, delete "to," and insert -- to --, therefor.

In column 11, line 2, before "photocurrent" delete "dark-current".

Signed and Sealed this
Eighth Day of November, 2011

David J. Kappos
*Director of the United States Patent and Trademark Office*